United States Patent
Chung

(10) Patent No.: US 6,376,769 B1
(45) Date of Patent: Apr. 23, 2002

(54) HIGH-DENSITY ELECTRONIC PACKAGE, AND METHOD FOR MAKING SAME

(75) Inventor: Kevin Kwong-Tai Chung, Princeton, NJ (US)

(73) Assignee: Amerasia International Technology, Inc., Princeton Junction, NJ (US)

( * ) Notice: Subject to any disclaimer, the term of this patent is extended or adjusted under 35 U.S.C. 154(b) by 0 days.

(21) Appl. No.: 09/524,148

(22) Filed: Mar. 14, 2000

Related U.S. Application Data

(60) Provisional application No. 60/134,656, filed on May 18, 1999, provisional application No. 60/136,917, filed on Jun. 1, 1999, provisional application No. 60/141,344, filed on Jun. 28, 1999, provisional application No. 60/150,437, filed on Aug. 24, 1999, and provisional application No. 60/150,869, filed on Aug. 26, 1999.

(51) Int. Cl.[7] .......................... H01L 23/28; H01L 23/02
(52) U.S. Cl. ...................... 174/52.2; 361/749; 361/760; 257/685; 257/686; 174/260
(58) Field of Search ............................... 174/52.2, 52.3, 174/52.4, 255, 259, 266, 262, 264; 361/749, 750, 760, 792, 795; 257/686, 685, 688, 700, 758; 439/67, 77

(56) References Cited

U.S. PATENT DOCUMENTS

| | | |
|---|---|---|
| 3,555,364 A | 1/1971 | Matcovich |
| 4,734,825 A | 3/1988 | Peterson |
| 5,043,794 A | 8/1991 | Tai et al. |
| 5,148,265 A | 9/1992 | Khandros et al. |
| 5,172,303 A | 12/1992 | Bernardoni et al. |
| 5,192,716 A | 3/1993 | Jacobs |
| 5,286,926 A | 2/1994 | Kimura et al. |
| 5,347,159 A | 9/1994 | Khandros et al. |
| 5,367,764 A | 11/1994 | DiStefano et al. |
| 5,371,654 A | 12/1994 | Beaman et al. |
| 5,375,041 A | 12/1994 | McMahon |
| 5,386,341 A | 1/1995 | Olson et al. |
| 5,394,303 A | 2/1995 | Yamaji |
| 5,473,119 A * | 12/1995 | Rosenmayer et al. ........ 174/255 |
| 5,483,421 A * | 1/1996 | Gedney et al. .............. 361/771 |
| 5,548,091 A | 8/1996 | DiStefano et al. |
| 5,558,928 A | 9/1996 | DiStefano et al. |
| 5,570,504 A | 11/1996 | DiStefano et al. |
| 5,583,321 A | 12/1996 | DiStefano et al. |

(List continued on next page.)

FOREIGN PATENT DOCUMENTS

| | | |
|---|---|---|
| WO | WO 98/26476 | 6/1998 |
| WO | WO 98/44564 | 10/1998 |

OTHER PUBLICATIONS

Co Van Veen, *IC Packaging And Assembly Issues For Next Generation Miniaturised Consumer Electrons*, Future Fab International,, pp. 379–382 (4 pages).

(List continued on next page.)

*Primary Examiner*—Dean A. Reichard
*Assistant Examiner*—Carmelo Oliva
(74) *Attorney, Agent, or Firm*—Dann, Dorfman, Herrell & Skillman, P.C.

(57) ABSTRACT

A high density electronic package includes a low-modulus-of-elasticity flexible adhesive interposer substrate to which an electronic device, such as a semiconductor chip or die or other component, is attached. The flexible adhesive interposer substrate includes a sheet or layer of a molecularly flexible adhesive having via holes therein in which are built up conductive vias to which contacts of the electronic device connect. A thin layer of metal foil on one surface of the flexible adhesive sheet is patterned to provide contacts and to connect electrically to the conductive vias. The electronic device may be covered by a lid or by an encapsulant attached to the flexible adhesive interposer substrate and/or the electronic device. An electronic package may include a plurality of electronic devices and respective flexible adhesive interposers that are electrically interconnected.

71 Claims, 16 Drawing Sheets

U.S. PATENT DOCUMENTS

| | | | |
|---|---|---|---|
| 5,665,473 A | * | 9/1997 | Okoshi et al. ............... 428/457 |
| 5,672,548 A | | 9/1997 | Culnane et al. |
| 5,682,061 A | | 10/1997 | Khandros et al. |
| 5,685,885 A | | 11/1997 | Khandros et al. |
| 5,686,699 A | | 11/1997 | Chu et al. |
| 5,734,555 A | | 3/1998 | McMahon |
| 5,777,379 A | | 7/1998 | Karavakis et al. |
| 5,783,870 A | | 7/1998 | Mostafazadeh et al. |
| 5,794,330 A | | 8/1998 | DiStefano et al. |
| 5,798,564 A | | 8/1998 | Eng et al. |
| 5,801,439 A | | 9/1998 | Fujisawa et al. |
| 5,848,467 A | | 12/1998 | Khandros et al. |
| 5,861,666 A | | 1/1999 | Bellaar |
| 5,875,545 A | | 3/1999 | DiStefano et al. |
| 5,901,041 A | | 5/1999 | Davies et al. |
| 5,915,170 A | | 6/1999 | Raab et al. |
| 5,926,369 A | | 7/1999 | Ingraham et al. |
| 5,929,517 A | | 7/1999 | DiStefano et al. |
| 5,943,213 A | | 8/1999 | Sasov |
| 5,950,304 A | | 9/1999 | Khandros et al. |
| 6,108,210 A | * | 8/2000 | Chung ....................... 361/747 |

OTHER PUBLICATIONS

Jack Fisher, *Advancements in Multilayer Material Technology*, Future Circuits International, 4 pages.

Petri Savolainen, *Area Array Packages And High–Density Printed Wiring Boards*, Future Circuits International, pp. 193–195 (3 pages).

Patrick Thompson, *Chip–scale Packaging*, IEEE Spectrum, Aug. 1997, pp. 36–43 (8 pages).

Dennis Herrell, *Power to the Package*, IEEE Spectrum, Jul. 1999, pp. 46–53 (8 pages).

Vern Solberg, *Chip–Scale Array Devices*, Future Circuits International, 5–pages.

Joan Tourné, *The Future Of Non–Woven Laminates*, Future Circuits International, pp. 129–131 (3 pages).

Walter Olbrich, *High Density Printed Circuit Board Technologies*, Future Circuits International, pp. 133–138 (6 pages).

Ivan Ho, *Microvia Technology*, Future Circuits International, pp. 139–141 (3 pages).

Dieter Bergman, *BGAs The Component Package Of Choice*, Future Circuits International, 7 pages.

Mark Hutton, *High Density Substrates for IC Packaging*, Future Circuits International, 3 pages.

Ravi M. Bhatkal, *Techno–Economic Analysis of Alternative Wafer Bumping Technologies*, Future Circuits International, 4 pages.

* cited by examiner

HIGH-DENSITY ELECTRONIC PACKAGE, AND METHOD FOR MAKING SAME

This Application claims the benefit of U.S. Provisional Application Serial No. 60/134,656 filed May 18, 1999, of U.S. Provisional Application Serial No. 60/136,917 filed Jun. 1, 1999, of U.S. Provisional Application Serial No. 60/141,344 filed Jun. 28, 1999, of U.S. Provisional Application Serial No. 60/150,437 filed Aug. 24, 1999, and of U.S. Provisional Application Serial No. 60/150,869 filed Aug. 26, 1999.

The present invention relates to a package for an electronic device and, in particular, to a package for an electronic device that includes a flexible substrate including a flexible dielectric adhesive having a low modulus of elasticity.

As semiconductor integrated circuit technology has advanced to greatly increase the amount and operating speed of the circuitry that can be fabricated on a single semiconductor chip, it has become more difficult to effectively utilize such integrated circuits due to the greatly increased number of input and output connections to the chip and the decreasing spacing or pitch of those connections. This was formerly less of a problem because semiconductor chips were mounted into mechanical packages, such as flat-packs and dual-in-line packages, that provided relatively widely-spaced and easily solderable or weldable leads, but were much larger than the semiconductor chip it contained. The connection problem has become more severe where the numbers of connections exceeds that conveniently or economically attainable in a conventional mechanical package.

One approach to solve this problem utilizes semiconductor chips mounted with contacts against and connecting to corresponding contacts on the next-level circuit board, the so-called "flip-chip" mounting. This flip-chip technique requires that the contacts on the next-level circuit board be of substantially the same size and of the same pitch as are those on the semiconductor chip. In particular, the pitch of the semiconductor chip connections has become much finer than the pitch attainable on conventional mechanical packages and printed wiring circuit boards to which such semiconductor chips are mounted. In addition, the differences in thermal expansion between the semiconductor chip and the next-level circuit board produces thermally-induced stress that leads to failure or degradation of the interconnections when exposed to thermal cycling, which stress is often exacerbated by the rigidity of the solder interconnections therebetween.

A further solution to these problems has employed an intermediate substrate between the semiconductor chip and the next-level circuit board to absorb some of the thermally-induced stress, and also to allow the fanning out of the connections to the semiconductor chip to permit a larger contact size and pitch that is compatible with conventional printed wiring circuit board technology. If the intermediate substrate is substantially larger than the size of the semiconductor chip, then the advantage of small chip size is lost, as is the advantage of short electrical lead length that improves the ability to operate the circuit at very high operating frequencies. While this has been addressed by reducing the size of the intermediate substrate and employing next-level substrate technologies capable of finer line widths and smaller features, the rigidity of the intermediate substrate has again posed some difficulties. Electronic packages where the perimeter of the intermediate substrate is no more than about 20% larger than the perimeter of the semiconductor chip mounted thereon are often referred to as "chip scale packages," although larger packages are often also referred to as "chip scale packages."

The difficulties of rigid intermediate substrates has been addressed by making the substrates of specialized materials that are referred to as being "flexible," such as thin polyimide and other so-called "flexible" conventional substrates on which printed wiring conductors and plated through holes can be formed by conventional methods. But, such substrate materials are not truly flexible in that they do not have a low modulus of elasticity, but only flex to a greater extent because they have been made of thinner material having a high modulus of elasticity. Conventional materials, such as polyimide sheet, have a high modulus of elasticity, e.g., a modulus greater than 70,000 kg/cm$^2$ (1,000,000 psi). In addition, the use of such materials and conventional fabrication methods results in an increased cost that is undesirable and may require assembly processes that are more difficult or expensive to perform.

In addition, enclosed cavity packages are often preferred due to their resistance to the entry of moisture, such as the hermetically-sealed packages usually employed in high reliability, military, aerospace, and medical electronic applications, and in applications of optical devices and frequency-sensitive communication devices. Such packages are generally metal or ceramic with seals formed of glass or metal solders or brazing. The ability of a package to resist the entry of moisture, or to allow the easy exit of moisture, is of importance to reliability of operation. Typically, hermetic type packages are most reliable; lidded packages are less reliable than hermetic packages, but are more reliable than are glob-top, molded or encapsulated packages. In addition, a cavity-type package can offer advantage in that less mechanical stress is imposed on the semiconductor chip than is the case with glob-top or molded packaging, as is important for stress-sensitive components such as optical devices, sensors, frequency crystals, multiple-chip modules, and the like.

Conventional hermetic cavity type packages are very expensive, due to the metal and/or ceramic package, the slow methods utilized for sealing the rim of the package lid and high labor content. Lidded cavity packages are much less expensive than hermetic packages, but are still expensive as compared to encapsulated packages, such as the molded epoxy or molded plastic encapsulated packages, that are employed in about 95–99% of commercial electronic applications. Even glob-top encapsulated packaging is more expensive than molded packages due to the inherently slow process of dispensing precise amounts of encapsulant, even using precision dispensing equipment. Specifically, a hermetic cavity type package can have a material cost of US$0.90–1.00 or more and a conventional lidded package with dispensed adhesive can have a material cost of US$0.20–0.40, as compared to a molded epoxy package which can have a material cost of only US$0.01–0.05 (exclusive of tooling).

Accordingly, there is a need for an electronic package that is suitable for a high-density (e.g., chip-scale) package, and that avoids some of the technical disadvantage of conventional molded packages without the high cost of conventional hermetic packages.

To this end, the present invention comprises an electronic package having contacts adapted to be attached to a substrate, wherein the electronic package comprises at least one electronic device, said electronic device having a plurality of contacts thereon, a flexible dielectric adhesive interposer, and means for connecting the contacts of the electronic device to certain ones of the conductive vias. The flexible dielectric adhesive interposer includes at least one layer of flexible dielectric adhesive having a modulus of elasticity less than about 35,000 kg/cm² (about 500,000 psi), a plurality of conductive vias through the layer of flexible dielectric adhesive, wherein at least certain ones of the plurality of conductive vias correspond to ones of the contacts of the electronic device, and a metal foil on one surface of the layer of flexible dielectric adhesive, wherein the metal foil is patterned and is in electrical contact with ones of the conductive vias. One of the plurality of conductive vias and the patterned metal foil includes contacts adapted to be attached to a substrate.

According to another aspect of the invention, an electronic package for plural electronic devices comprises a plurality of electronic devices, each electronic device having a pattern of a plurality of contacts thereon, a plurality of flexible dielectric adhesive interposers each associated with at least one of the plurality of electronic devices, and means for connecting the contacts of each of the plurality of electronic devices to certain ones of conductive vias of the flexible dielectric adhesive interposer with which it is associated. Each flexible dielectric adhesive interposer includes at least one layer of flexible dielectric adhesive having a modulus of elasticity less than about 35,000 kg/cm² (about 500,000 psi), a plurality of conductive vias through the layer of flexible dielectric adhesive, wherein at least certain ones of the plurality of conductive vias correspond to ones of the contacts of the associated one of the plurality of electronic devices, and a metal foil on one surface of the layer of flexible dielectric adhesive, wherein the metal foil is patterned and is in electrical contact with ones of the conductive vias. At least one of the plurality of conductive vias and the patterned metal foil includes external contacts adapted for connecting the flexible dielectric adhesive interposer to an external device. The plurality of flexible dielectric adhesive interposers are positioned adjacent each other and further comprise means for connecting the external contacts of each of the plurality of flexible dielectric adhesive interposers to the external contacts of an adjacent one of the plurality of flexible dielectric adhesive interposers.

Further, a method of making an electronic package for an electronic device comprises:

providing a sheet of metal foil;

providing at least one layer of a flexible dielectric adhesive having a modulus of elasticity less than about 35,000 kg/cm² (about 500,000 psi) on one surface of the sheet of metal foil, the layer of flexible dielectric adhesive having a plurality of via openings therein;

building up conductive material on the metal foil to fill the via openings, thereby forming conductive vias therein;

patterning the metal foil to form a pattern of contacts and conductors electrically connected to the conductive vias in the flexible dielectric adhesive layer;

plating at least one of the conductive vias and the contacts of the patterned metal foil to provide external contacts; and electrically connecting contacts of at least one electronic device to corresponding ones of the conductive vias.

BRIEF DESCRIPTION OF THE DRAWING

The detailed description of the preferred embodiments of the present invention will be more easily and better understood when read in conjunction with the FIGURES of the Drawing which include.

DESCRIPTION OF THE PREFERRED EMBODIMENT

Figure 1:
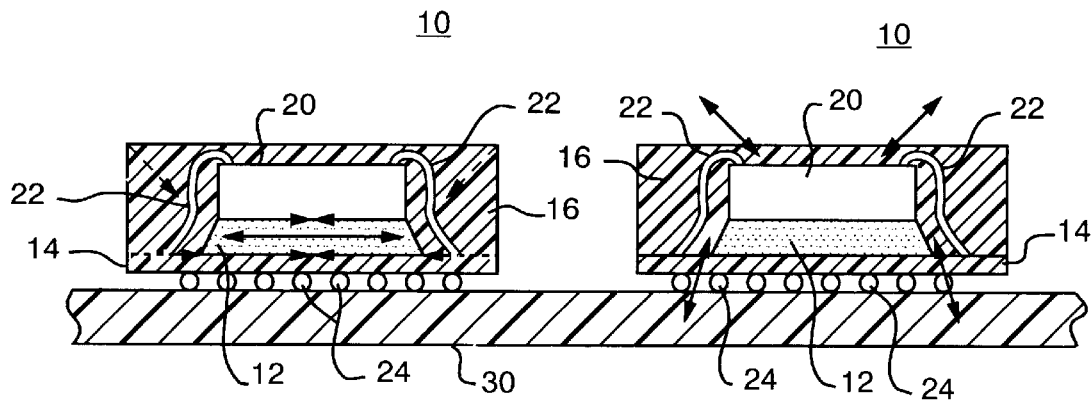
FIGS. 1 and 2 are side cross-sectional schematic diagrams of a molded electronic package and a lidded electronic package, respectively, useful in understanding the effects of thermally-induced stress and of moisture sealing.

FIG. 1 is a side cross-sectional schematic diagram of two molded electronic packages 10 useful in understanding the effects of thermally-induced stress and of moisture sealing. Each molded package 10 includes a semiconductor chip or die 20 attached to an intermediate laminated substrate 14, such as an FR4 laminate, by a die attach adhesive 12. Bond wires 22, which are fine gold or aluminum wires, connect the contacts of semiconductor chip 20 to corresponding conductors on substrate 14 which are in turn connected to conductors on next-level substrate 30 by connections 24 which may be of solder or electrically-conductive adhesive.

The semiconductor chip 20 and bond wires 22 are encapsulated by molded encapsulant 16 which provides mechanical support and a moisture barrier.

Mechanical stresses, which are illustrated by arrows on the left-hand package 10, arise due to the differences in the coefficients of thermal expansion (CTE) of the different materials utilized in module 10 and the high moduli of elasticity (ME), i.e. rigidity, thereof. Silicon semiconductor die 20 has a CTE of about 3 ppm/°C., adhesive 12 has a CTE of about 40 ppm/°C., substrate 14 has a CTE of about 17 ppm/°C., and encapsulant 16 has a CTE of about 30 ppm/°C. Silicon semiconductor die 20 has a ME of about 700,000–1,400,000 kg/cm$^2$ (about 10,000,000–20,000,000 psi), adhesive 12 has a ME of about 70,000 kg/cm$^2$ (about 1,000,000 psi), and substrate 14 and encapsulant 16 have a ME of about 140,000 kg/cm$^2$ (about 2,000,000 psi). Principally, stress arises in adhesive 12 as indicated by the horizontal outward-directed arrows indicating tension and at the interfaces of adhesive 12 with chip 20 and substrate 14 indicated by the inward-directed arrows indicating compression, and to a lesser extent in encapsulant 16 as indicated by the inward-directed dashed arrows. The magnitude of the stress depends upon the magnitude of the differences in CTE, the curing temperature of the adhesive 12 and the encapsulant 16, and the modulus of elasticity of the adhesive 12 and encapsulant 16.

There are two schools of thought on moisture sealing of electronic packages. One school is to allow moisture to easily and quickly escape from a package, which usually means that it is also free to enter the package, while the other school is to create as close to a hermetic seal as is possible. As illustrated by the right-hand molded package 10 of FIG. 1, moisture is allowed by the encapsulant 16 to enter the package 10 relatively slowly, and also to escape relatively slowly, as indicated by the double-ended arrows entering/leaving right-hand package 10. If there is any delamination at the interface between adhesive 12 and semiconductor chip 20 or substrate 14, or at the interface between encapsulant 16 and semiconductor chip 20, moisture may enter therein, and may tend to remain there for a substantial time even after the environment external to package 10 has returned to a dry or low humidity condition and/or temperature condition.

Figure 2:
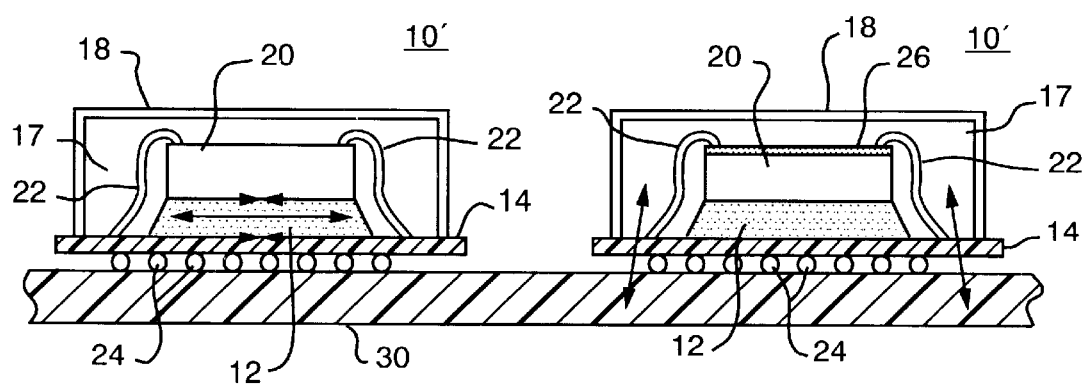

FIG. 2 is a side cross-sectional schematic diagram of two lidded electronic packages 10' useful in understanding the effects of thermally-induced stress and of moisture sealing. Elements of each lidded package 10' that bear the same numerical designations as corresponding elements of molded package 10 are of like type and kind thereto. Each lidded package 10' differs from molded package 10 in that encapsulant 16 is eliminated and an adhesively-attached lid 18 covers and provides mechanical protection for semiconductor chip 20. In addition, semiconductor chip 20 has a moisture barrier coating 26 applied to its upper surface in areas not having contacts to which bond wires 22 attach, which coating 26 may also prevent corrosion or oxidation thereof.

Because the materials of lidded package 10' are the same as those of molded package 10, the stresses induced and the sources thereof are the same as described above in relation to FIG. 1, i.e. principally tensile and compressive stress in relation to adhesive 12 and the interfaces thereof except that stress surrounding chip 20 due to encapsulant 16 is eliminated.

As to moisture resistance, substrate 14 of lidded package 10' allows moisture to penetrate with relative ease so as to reduce the likelihood of condensation within the cavity 17 formed by substrate 14 and lid 18. Should condensation occur, it is most likely to be on the exposed surfaces within such cavity 17, rather than at he interfaces with adhesive 12. A moisture barrier or condensation preventing coating 26, such as a silicone or other hydrophobic molecular structure polymer, will prevent corrosion of the contacts of chip 20 or interference with its operation due to condensed moisture.

On the other hand, by employing an intrinsically or molecularly flexible "interposer" or intermediate substrate, the stress build up of the prior art packages is avoided and reliable electronic packages, including chip-scale packages, may be inexpensively made. An intrinsically flexible or molecularly flexible material is a material that is flexible as a result of its molecular structure, and not just because it has been formed into a very thin sheet. Steel, aluminum and glass can be flexed if made thin enough, but none is intrinsically flexible. As used herein, flexible means a material that has a modulus of elasticity that is less than about 35,000 kg/cm$^2$ (500,000 psi) and that withstands an elongation of at least 30% in length without failure. Thus, conventional substrate materials, such as FR4 laminate which has a modulus of elasticity of about 140,000 kg/cm$^2$ (about 2,000,000 psi) and polyimide which has a modulus of elasticity of about 140,000 kg/cm$^2$ (about 2,000,000 psi), and bismaleimide-triazine, are not flexible as that term is used herein.

Figure 3:
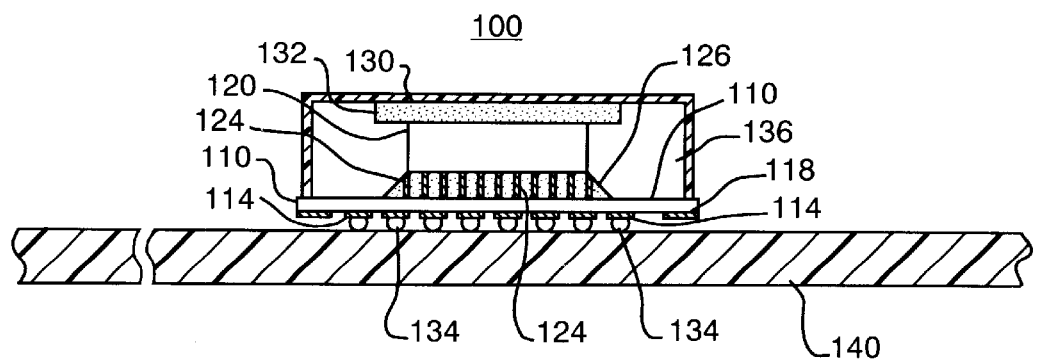
FIGS. 3, 4 and 5 are side cross-sectional schematic diagrams of alternative exemplary embodiments of an electronic package according to the present invention attached to a next-level substrate.

FIG. 3 is a side cross-sectional schematic diagram of an exemplary embodiment of an electronic package 100 according to the present invention attached to a next-level substrate 140. Package 100 includes a flexible interposer 110 upon which an electronic device, for example, semiconductor chip 120, is attached. Contacts on the bottom face of chip 120 are directly connected to contacts 112 of interposer 110 by interconnections 124, which are preferably an electrically-conductive flexible adhesive. Where support for chip 120 in addition to that provided by connections 124 is desired, flexible dielectric underfill adhesive 126 is employed to fill the volume between chip 120 and interposer 110 that is not filled by flexible connections 124. Contacts 114 on interposer 110, which contacts 114 correspond to contacts 112 on the opposing surface thereof, provide contacts for connections 134 between package 100 and conductors on next-level circuit substrate 140, and are preferably metal. Connections 134 may be conventional solder connections or electrically-conductive adhesive as in a ball grid array (BGA) package, and an underfill material is not required between package 100 and next-level substrate 140.

Preferably, flexible adhesive interposer 110 comprises a layer of flexible dielectric adhesive on a sheet of metal foil, such as a copper, nickel, aluminum or other electrically-conductive metal or an alloy thereof, that is subsequently etched to define the pattern of contacts 114. Via holes in the flexible dielectric layer are filled with conductive material, such as built up flexible conductive adhesive or metal to provide electrical connection to contacts 112. The flexible adhesive of interposer 110 has a modulus of elasticity that is less than about 35,000 kg/cm$^2$ (about 500,000 psi), and preferably is less than about 14,000 kg/cm$^2$ (about 200,000 psi), and more preferably is about about 7,000 kg/cm$^2$ (about 100,000 psi), and most preferably is about 1,400 kg/cm$^2$ (about 20,000 psi). Suitable flexible dielectric adhesives include, for example, type ESP7450 screen-printable flexible thermosetting dielectric adhesive and type UVS7450 photo-etchable flexible thermosetting dielectric adhesive, both of which have a modulus of elasticity of about 1,400 kg/cm$^2$ (about 20,000 psi) and a CTE of about 100 ppm/°C., and are available from AI Technology, Inc., located in Princeton, N.J. Suitable flexible electrically-conductive adhesive that may be employed to fill via holes in the dielectric layer of interposer 110 or to form connections 124 include types ESP8450 and ESP8550 flexible electrically-conductive thermosetting adhesive also available from AI Technology, Inc. Flexible interposer 110 and the making thereof is described in detail herein below.

Lid or cover 130 is attached to interposer 110 by an adhesive to enclose chip 120 and provide mechanical protection therefor. Where additional mechanical support is desired, a flexible adhesive pad 132 may be employed to join the inner surface of lid 130 to the upper face of chip 120. Lid 130 may be plastic, glass, ceramic or metal, as desired. Where it is desired to remove heat from chip 120, lid 130 may be made of a thermally conductive material, such as copper, brass, steel or aluminum, and flexible adhesive 132 may include thermally-conductive particles to provide a thermal connection between chip 120 and lid 130 from whence heat may be dissipated. Where it is desired that light be permitted to pass through lid 130 and impinge upon chip 120, lid 130 or at least the top thereof may be optically transparent to light of the desired wavelength(s). In addition, an optional metallic rim 118 may be provided on flexible adhesive interposer 110 to stiffen interposer 110 in the peripheral region thereof where lid 130 is attached.

Figure 4:
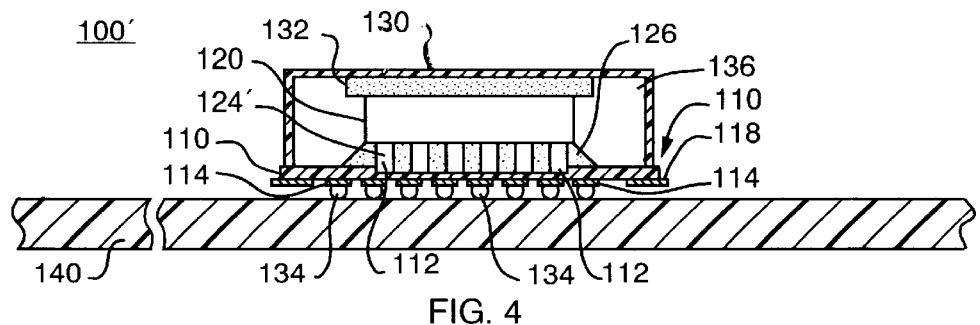

FIG. 4 is a side cross-sectional schematic diagram of an alternative exemplary embodiment of an electronic package 100' according to the present invention attached to a next-level substrate 110. Package 100', like package 100, includes flexible interposer 110, and electronic device or chip 120 attached thereto with contacts on chip 120 directly connected to contacts 112 of interposer 110 by interconnections 124. For package 100', because flexible adhesive interposer 110 is molecularly flexible, interconnections 124 are preferably metal solder connections such as are known and in widespread use in the flip chip mounting of electrical devices. Where support for chip 120 in addition to that provided by solder connections 124 is desired, a flexible dielectric adhesive or a rigid dielectric underfill 126 is employed to fill the volume between chip 120 and interposer 110 that is not filled by solder connections 124. Interposer contacts 114 provide contacts for BGA solder or conductive adhesive connections 134 between package 100' and conductors on next-level circuit substrate 140; an underfill is not required between package 100 and next-level substrate 140.

Like package 100, lid 130 attached to interposer 110 of package 100' provides mechanical protection for chip 120, and may be plastic or metal, or thermally conductive, as desired. Flexible adhesive pad 132 may be employed to provide added mechanical support for chip 120 and may be thermally conductive, and optional metallic rim 118 may be provided for stiffening, all as described above.

It is noted that the flexible adhesive bumps of package 100 and the solder bumps of package 100' that form respective connections 124 may be deposited onto or otherwise applied to chip 120, either at the semiconductor die level or at the semiconductor wafer level, before chip 120 is attached to flexible adhesive interposer 110, or may be applied to contacts 112 of interposer 110.

Figure 5:
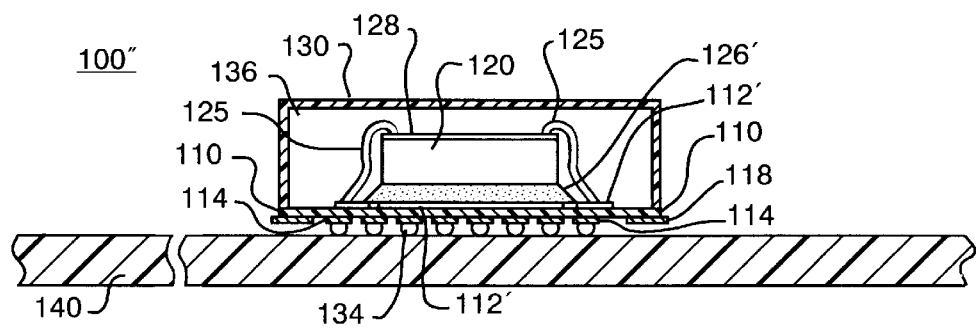

FIG. 5 is a side cross-sectional schematic diagram of an alternative exemplary embodiment of an electronic package 100" according to the present invention attached to a next-level substrate 110. Package 100", like packages 100 and 100', includes flexible interposer 110, and electronic device or chip 120 attached thereto, but with contacts on chip 120 connected to contacts 112' of interposer 110 by bond wires 125. Bond wires 124 are preferably fine gold or aluminum wires, such as are known and in widespread use in electrical devices. Contacts 112 may be formed of standard lead-frame metals, such as copper, nickel or kovar alloy, which and may also form a die-attach pedestal under chip 120 as well. Chip 120 is attached to flexible adhesive interposer 110 by a flexible or a rigid die-attach adhesive 126'. Interposer contacts 114 provide contacts for BGA solder or conductive adhesive connections 134 between package 100' and conductors on next-level circuit substrate 140; without underfill. Lid 130 attached to interposer 110 provides mechanical protection for chip 120. An optional flexible adhesive pad 132 may be employed to provide added mechanical support and covering for chip 120, and optional metallic rim 118 may be provided for stiffening, all as described above.

It is noted that because flexible adhesive interposer 110 of packages 100, 100', 100" of FIGS. 3–5 is molecularly flexible as defined above, one or both of connections 124 and connections 134 may be metal solder connections such as the so-called "C$^4$" solder connections known and in widespread use in the flip chip mounting of electrical devices, without thermally-induced stresses jeopardizing the integrity and reliability of the electrical connections they provide, despite the very rigid nature of the solder, e.g., a modulus of elasticity of about of about 700,000 kg/cm$^2$ (about 10,000,000 psi) and a CTE of about 20–25 ppm/°C.

Where the flexible interposer 110 of the packages 100, 100', 100" of FIGS. 3–5 allows moisture to enter into the volume of cavity 136 defined by lid 130, chip 120 and flexible interposer 110, moisture will also exit cavity 136 with relative ease, however, if moisture is present within cavity 136 and the temperature were to drop, then moisture may condense on the surfaces of interposer 110, chip 120 and lid 130 within cavity 136. The presence of such condensed moisture could lead to corrosion or oxidation of certain materials such as the metals of which various conductors and contacts are formed. Such condensation is most likely to occur while chip 120 is not being operated, e.g, while it is unpowered. When chip 120 is powered, it is likely that the heat generated thereby will raise the temperature of chip 120 and so avoid condensation on chip 120. Thus, condensation is likely to be only intermittent at worst and to occur during an unpowered condition.

Where semiconductor chip 120 is attached to flexible adhesive interposer 110 in a flip-chip arrangement as in FIGS. 3 and 4, for example, dielectric adhesive underfill 126 protects the contacts of chip 120 and flexible adhesive interposer 110 against condensation. In addition, where moisture is expected to enter cavity 136, it is preferred that the dielectric adhesive of underfill 126 be hydrophobic to further diminish the possibility of condensation forming on the contacts of chip 120 and flexible adhesive interposer 110. Similarly, where semiconductor chip 120 is mounted for wire-bond connections as in FIG. 5, the contacts of chip 120 are exposed and chip 120 may be covered with a suitable protective coating 128, preferably a flexible hydrophobic coating, to reduce the possibility of corrosion. Suitable hydrophobic adhesives for such underfill and coating include types CP7135, CP7130 and ESP7450 flexible hydrophobic dielectric adhesives available from AI Technology, Inc., in which the carrier medium is typically a non-polar hydrophobic polymer.

It is also noted that where lid 130 includes a pre-applied adhesive around the edges thereof that adhesively attach to flexible adhesive interposer 110, packages 100, 100', 100" may be assembled in an in-line process, such as by standard pick-and-place component mounting equipment. While such lids 130 may be provided in several ways including by dispensing adhesive onto each lid or cover, or by applying an adhesive preform to each lid or cover, adhesive preform lids and covers as described in U.S. patent application Ser. No. 09/232,936 filed Jan. 19, 1999 entitled "Method Of Making An Adhesive Preform Lid, As For An Electronic Device" and laminated adhesive lids and covers as described in U.S. Pat. No. 6,136,128 (U.S. patent application Ser. No. 09/337,453 filed Jun. 21, 1999) entitled "Method Of Making A Laminated Adhesive Lid, As For An Electronic Device" which are expressly incorporated herein by reference in their entireties, are well suited to packages 100, 100' and 100". With such low cost lids and covers and in-line processing, the cost of packages according to the present invention could be comparable to the cost of glob-top and molded encapsulation packages.

Figure 6A:
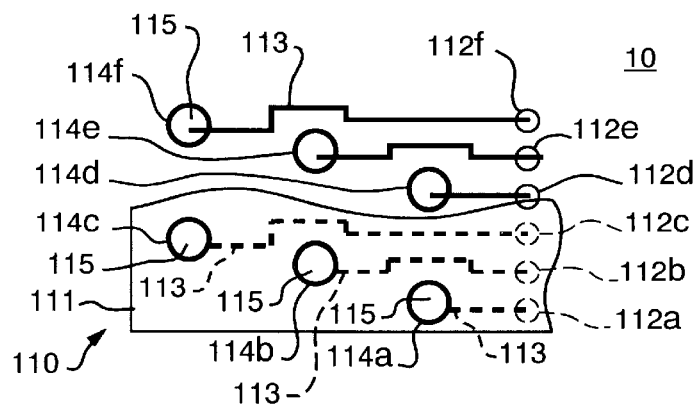
FIGS. 6A and 6B are schematic diagrams of exemplary "fan-out" contact patterns useful with an interposer in the embodiments of FIGS. 3–5.
Figure 6B:
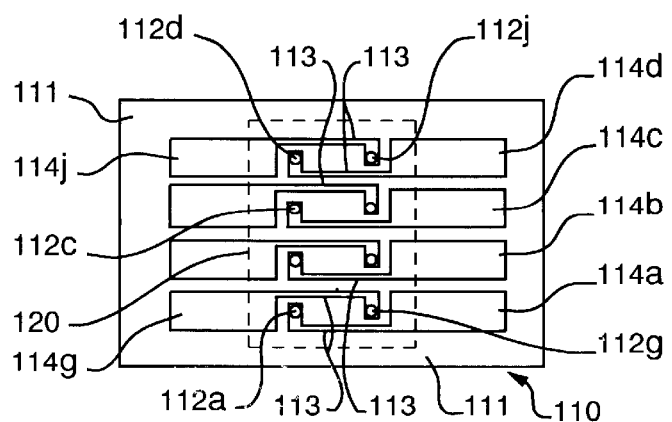

FIGS. 6 and 6B are schematic diagrammatic illustrations of exemplary "fan-out" patterns useful with a flexible adhesive interposer 110 (shown in part) of the embodiments of FIGS. 3–5. Semiconductor chip 120 is fabricated by conventional methods that permit very fine features to be formed therein, e.g., dimensions of about 1 μm and larger, including very small size electrical conductors and contacts that are also very closely spaced. But such features are too fine to be compatible with typical low-cost conventional next-level substrates 140, such as FR4 printed wiring circuit boards, which typically have features of at least 50 μm (about 2 mils) and larger. Because the pattern of contacts 112 of flexible adhesive interposer 110 that correspond to the pattern of contacts of semiconductor chip 120 need not be the same pattern as the pattern of contacts 114 of flexible adhesive interposer 110 that correspond to a pattern of contacts on next-level substrate 140, a fan-out arrangement of contacts 112, 114 and conductors 113 may be employed to space apart contacts 112 and 114 that complete connections between contacts on semiconductor chip 120 and those on next-level substrate 140, respectively.

In FIG. 6A, for example, contacts 112a–112f to which contacts of semiconductor chip 120 attach may be 50 μm (about 2 mils) in diameter and at a pitch (center-to-center spacing) of 100 μm (about 4 mils), and are on a first surface of flexible adhesive layer 111 of interposer 110, which layer 111 is shown partially removed. Contacts 114a–114f to which contacts of next-level substrate 140 attach may be 100 μm (about 4 mils) in diameter and at a pitch (center-to-center spacing) of 300 μm (about 12 mils), and are on a second and opposing surface of flexible adhesive layer 111 of interposer 110. Conductors 113 connect corresponding ones of contacts 112 and 114, e.g., connect contacts 112a and 114a, connect 112b and 114b, and so forth, and may be quite fine, e.g., about 25–50 μm wide, and of varying length to further space contacts 114 apart. Conductors 113 are in a sequence of lengths to remove contact 114a from contact 112a by about 0.5 mm (about 20 mils), contact 114b from contact 112b by about 1 mm (about 40 mils) and contact 114c from contact 112c by about 1.5 mm (about 60 mils). Conductive vias 115 through flexible adhesive layer 111 can be much smaller than contacts 114, e.g., about 50 μm (about 2 mils) in diameter.

Although conductors 113 are shown in FIG. 6A as being on the far surface of flexible adhesive layer 111 and connecting to contacts 114 through conductive vias 115, conductors 113 could be on the near surface of flexible adhesive layer 111 and connect to contacts 112 through conductive vias thereat. Flexible adhesive layer 111 is resistant to the solvents and other chemicals used in forming conductors 113, contacts 114 and conductive vias 115 thereon. In addition, it is noted that the locations of contacts 114 on interposer 110 may be outside the periphery of semiconductor chip 120, as illustrated, may be within the periphery of chip 120, or may be both outside and within the periphery of chip 120, i.e. at any location on flexible adhesive interposer 114.

In FIG. 6B, for example, an alternative fan-out arrangement not only expands the size and spacing of contacts 114 with respect to contacts 112 as in FIG. 6A, but also provides for contacts 112 and 114 to be in mirror image patterns, as is particularly useful where a semiconductor chip that was mounted in the manner of FIG. 5 is to be utilized in a package of the sort of FIGS. 3 or 4 in which it is to be mounted in a flip-chip manner which reverses the pattern of its contacts, for example, as viewed from the direction of next-level substrate 140. This reversal is removed by the pattern of conductors 113 which connect contacts 112 on the leftward edge of semiconductor chip 120 (shown in phantom) with the corresponding contacts 114 on the rightward portion of interposer 110, and also connect contacts 112 on the rightward edge of semiconductor chip 120 with the corresponding contacts 114 on the leftward portion of interposer 110. In the example of FIG. 6B, contacts 114 are large and rectangular, as might be useful where contacts 114 are to come into electrical contact with external conductors, as in a contact-type card or tag as could be employed for ingress/egress access, identification of personnel or equipment or other objects, credit, debit and telephone cards, and the like.

Among the additional advantages of the foregoing packages 100, 100', 100" are that they employ materials that are readily available at reasonable cost and may be fabricated utilizing standard "pick-and-place" equipment to attach semiconductor chips 120 and lids 130, for example, on an inherently fast, assembly-line arrangement, and so inherently offer the advantage of low cost, e.g., no more than two times the cost of the lowest cost conventional molded electronic packages.

Figure 7:
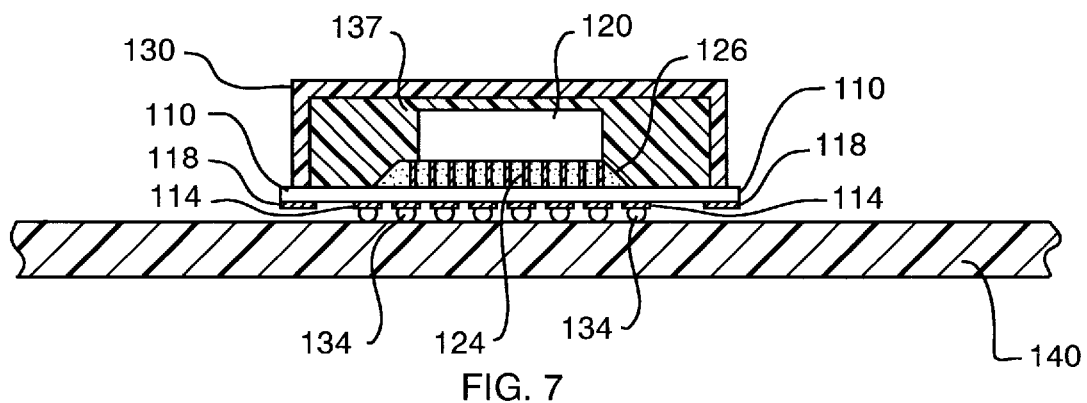
FIGS. 7, 8 and 9 are side cross-sectional schematic diagrams of alternative embodiments of the electronic packages according to the present invention attached to a next-level substrate as shown in FIGS. 3, 4 and 5, respectively.
Figure 8:
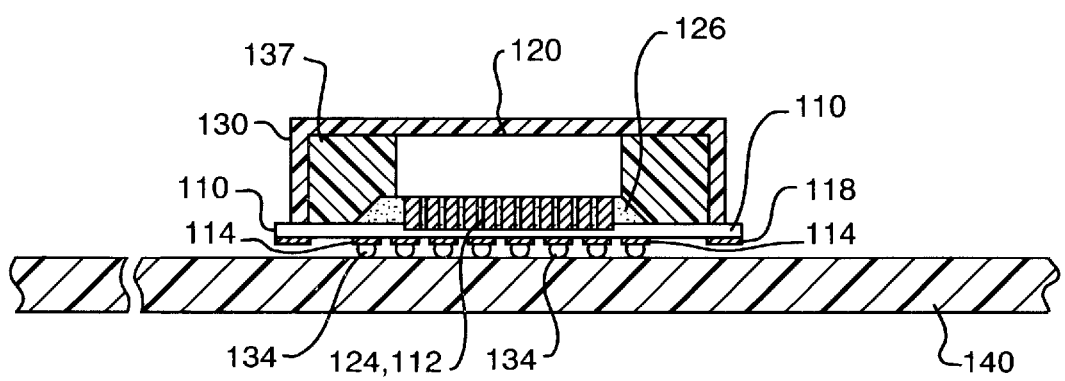
Figure 9:
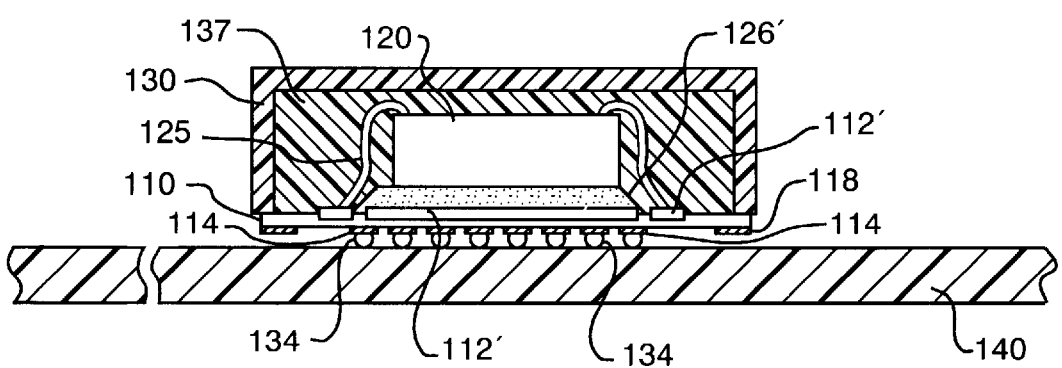

FIGS. 7, 8 and 9 are side cross-sectional schematic diagrams of alternative embodiments of the electronic packages 100, 100', 100" shown in FIGS. 3, 4 and 5, respectively, attached to next-level substrate 140. In each of these embodiments, cavity 136 is substantially filled with encapsulant 137. In these cases, lid or cover 130 may be utilized as an encapsulating form or mold and then may remain or be removed; alternatively, cover 130 may be eliminated and an encapsulating mold used. It is noted that the equipment and other infrastructure for molding encapsulant around electronic devices is known and available and so is easily utilized in relation to the present invention at low cost. Molding may be performed for "strips" and continuous reels having a series of electronic devices in a line thereon (one-dimensional arrays) or "panels" or wide continuous reels having a fixed number of electronic devices across the width thereof (two-dimensional arrays), similar to molding of conventional lead-framed packages. Depositing and finishing of solder balls 134 may likewise be performed on such one- and two-dimensional arrays of devices. The strips, continuous reel, panel or other arrangement may employ alignment holes therein for proper positioning of the various features of packages 100, 100' and 100". Further, the resistance of the molded package to the entry of moisture is likewise known, and may be improved by the fact that moisture may escape through the flexible adhesive of interposer 110, which would reduce the effect of expansion of trapped moisture due to heating during soldering of surface mount technology (SMT) packages, sometimes referred to as the "pop-corn" effect. Where semiconductor chip 120 is mounted in a flip-chip manner, an electrically-conductive hydrophobic flexible is preferred for connections between chip 120 and interposer 110 so as to further resist moisture, and a hydrophobic adhesive underfill 126 is likewise preferably a hydrophobic adhesive.

Suitable materials for encapsulant 137 include standard rigid encapsulants, such as known epoxy and liquid epoxy compounds utilized for molded and glob-top encapsulation, that have a CTE of about 30 ppm/°C. or less and a high modulus of elasticity, e.g., about 140,000 kg/cm² (about 2,000,000 psi).

Figure 10:
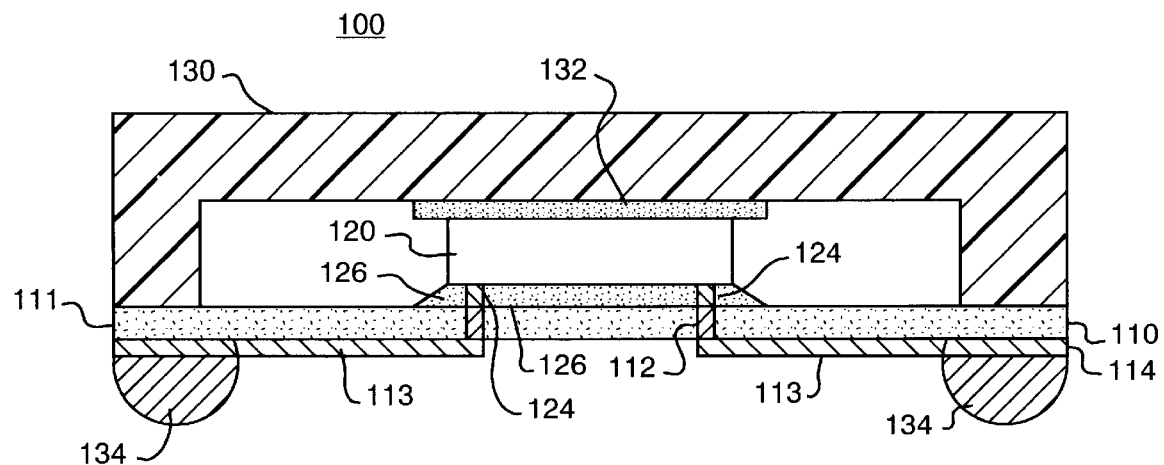
FIG. 10 is a side cross-sectional schematic diagram showing additional detail of the exemplary embodiment of an electronic package according to the present invention as shown in FIG. 3.

FIG. 10 is a side cross-sectional schematic diagram showing additional detail of the exemplary embodiment of an electronic package similar to package 100 of FIG. 3. Electronic device (chip or die) 120 is mounted to flexible adhesive interposer 110 in a flip-chip manner by flexible electrically-conductive adhesive connections 124 and optional flexible dielectric underfill adhesive 126. Flexible adhesive interposer 110 comprises flexible adhesive layer 111 and a metal layer providing conductors 113 thereon. Flexible adhesive layer 111 has via holes therethrough in which are conductive vias 112 which may be plated up of the same metal as metal conductors 113, such as a copper or copper alloy, for example, or may be a flexible electrically-conductive adhesive of like type to that of connections 124. The metal layer is patterned, such as by photo etching or printing, to provide conductors 113 between conductive vias 112 and metal contacts 114 on which are formed solder ball or solder bump contacts 134.

In an exemplary form of package 100 of FIG. 10, chip 120 may be about 25–500 μm (about 1–20 mils) thick, and more typically about 250–500 μm (about 10–20 mils) thick, and flexible adhesive layer 111 is about 75–250 μm (about 3–10 mils) thick with about 50–250 μm (about 2–10 mils) thick copper conductors 113 and contacts 114 thereon. Suitable flexible dielectric adhesives for interposer 110 include types ESP7450 and CC7450 flexible thermosetting adhesives and type UVS7450 flexible thermosetting adhesive, which is suitable for use with conventional UV photoresist and photo-etching chemicals and solvents, each of which is a polymer adhesive available from AI Technology, Inc. located in Princeton, N.J., or other suitable flexible adhesive, and each of which has suitable properties, such as low dielectric constant, low dielectric loss, good temperature stability, low sensitivity to moisture and the like. Conductive vias 112 of plated up copper are about 50–100 μm (about 2–4 mils) in diameter, as are conductive connections 124. Suitable electrically-conductive adhesives for connections 124 include type PSS8150 SOLDER-SUB® adhesive or type ESS8450 SOLDER-SUB® adhesive, each of which is a thermosetting electrically-conductive polymer adhesive also available from AI Technology, Inc., or other suitable flexible conductive adhesive, which desirably reduces the thermally-induced stress due to the temperature of the package, both in processing, such as in soldering solder connections 134, and in operation whether due to environment and power dissipation of chip 120. Suitable underfill adhesive 126 includes type MEE7650-5 flexible dielectric polymer adhesive also available from AI Technology. Solder bumps 134 are about 125–250 μm (about 5–10 mils) in diameter and somewhat less in height after being reflowed. Lid 130 is typically about 0.5–0.75 mm (about 20–30 mils) thick and may be attached to flexible adhesive interposer 110 with the same adhesive as is employed for adhesive underfill 126, for example. Optional adhesive interface 132 may be a dielectric adhesive such as type ESP7450 or type ESP7670 where additional mechanical support is desired, or may be an electrically conductive adhesive such as type PSS8150 SOLDER-SUB® adhesive or type ESS8450 SOLDER-SUB® adhesive where an electrical connection between chip 120 and cover 130 is also desired, or may be a thermally-conductive adhesive such as types ESP7455 and ESP7675 thermally conductive dielectric thermosetting adhesives also available from AI Technology. Lid 130 may be plastic or metal, and preferably is metal where either electrical conduction or thermal conduction through lid 130 is desired, unless an electrically-conductive or thermally-conductive plastic is suitable.

Figure 11:
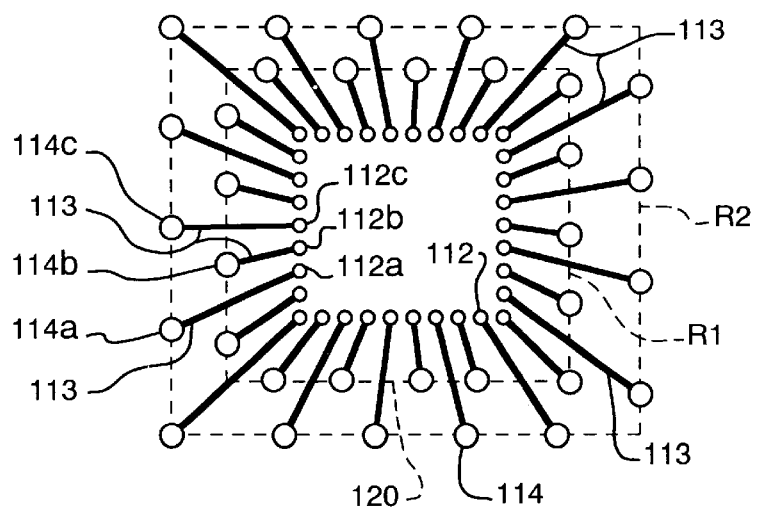
FIGS. 11 and 12 are schematic diagrams of exemplary fan-out contact patterns useful with an interposer in the embodiment of FIG. 10, as well as those of FIGS. 3–5.
Figure 12:
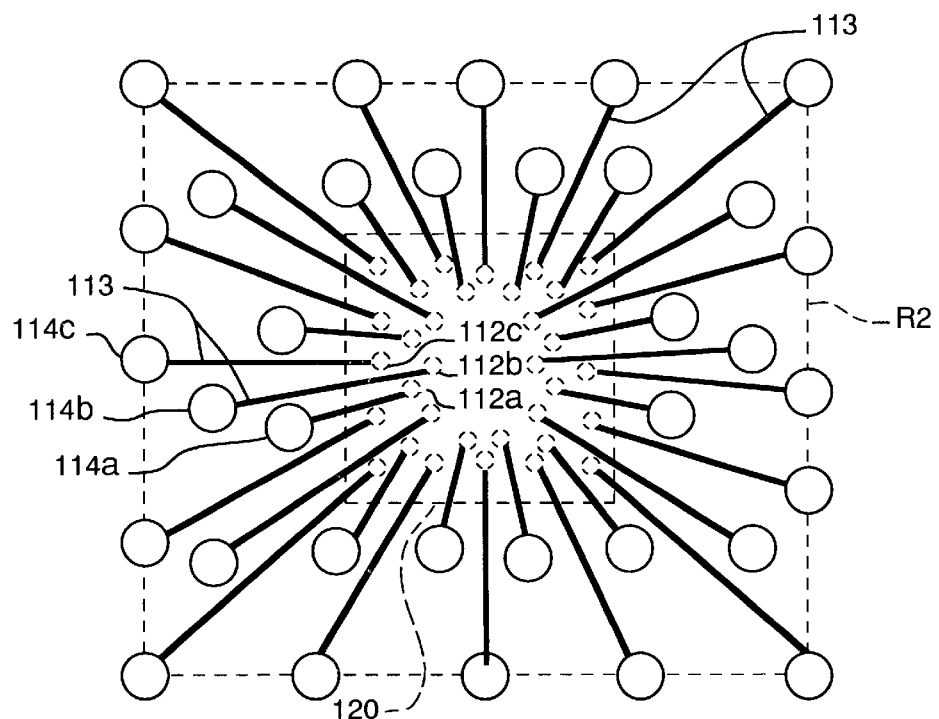

It is noted that flexible adhesive interposer 110 is well suited for fan out between the contacts of chip 120 and those of a next-level substrate 140, as illustrated in FIG. 10 by the spacing of the contacts of semiconductor chip 120 and thus of conductive vias 124 being closer than is the spacing of contacts 114 and solder bumps 134, as in a ball-grid-array (BGA) device. FIGS. 11 and 12 are schematic diagrams of exemplary fan-out contact patterns useful with a flexible adhesive interposer 110 in the embodiment of FIG. 10, as well as in the embodiments of FIGS. 3–5 and 7–9, and may accommodate standard, conventional or non-standard contact patterns. For example, FIG. 11 illustrates a chip 120 (shown in phantom) having its contacts located around the periphery thereof attaching to conductive vias 112, e.g., 112a, 112b, and so forth, which are connected by conductors 113 to corresponding contacts 114, e.g., 114a, 114b, and so forth, respectively, located on two concentric rectangular patterns or arrays R1 and R2 of contacts. Conductive vias 112 may be about 75 μm (about 3 mils) in diameter and at a 150 μm (about 6-mil) pitch and connect to corresponding contacts 114 through 75 μm (about 3-mil) wide conductors 113. Contacts 114 may be about 125–250 μm (about 5–10 mils) in diameter and at a 1 mm (about 40-mil) pitch with respect to conductors 113 if on pattern R1 and at a 2 mm (about 80-mil) or greater pitch if on pattern R2.

Similarly, FIG. 12 illustrates a semiconductor chip 120 (shown in phantom) having contacts located in a two dimensional or "area array" of positions, which may be a regular or an arbitrary or irregular array of positions, at which are conductive vias 112 that are connected by conductors 113 to an array of contacts 114 located in another two dimensional or area array of positions, which may be a regular array or may be an arbitrary or irregular array of positions. Typical dimensions thereof may be the same as or similar to those above in relation to FIG. 11. It is noted that the locations of contacts 114 on interposer 110 may be outside the periphery of semiconductor chip 120, as illustrated, may be within the periphery of chip 120, or may be both outside and within the periphery of chip 120, i.e. at any location on flexible adhesive interposer 114.

In addition to the advantages of electronic packages 100, 100' and 100" employing flexible adhesive interposer 110 as described above, flexible adhesive interposer 110 is made by methods that advantageously avoid many of the costly operations associated with the manufacture of conventional printed circuit wiring boards, such as the drilling of through holes in the substrate and the formation of plated-through conductor holes in the substrate material, the separate manufacture of plural different printed circuit wiring boards that must be laminated together to form a plural-layer printed circuit board, and the like. Moreover, flexible adhesive interposer 110 is truly flexible because the adhesive employed therein is molecularly flexible, i.e. it has a low modulus of elasticity, and not just because it is thin as is the case with conventional so-called flexible substrate materials.

As a result, flexible adhesive interposer 110 may be formed employing methods that permit very fine contacts and conductors at very close spacing, i.e. fine pitch.

Typically, flexible adhesive interposer 110 may be made as follows. A thin metal sheet or foil is provided from which contacts on one side of interposer 110 are formed. The metal foil may be copper or copper alloy (such as beryllium copper), nickel or nickel alloy, aluminum or aluminum alloy, or other suitable electrically-conductive metal, and preferably is an about 12.5–125 μm (about 0.5–5 mils) thick copper-based alloy, with a thickness of about 25–50 μm (about 1–2 mils) being typical. The surface of the metal foil may be prepared to improve the adhesion of an adhesive thereto, such as by abrasion or etching such as chemical or plasma etching or other suitable method. The metal foil should be patternable, such as by etching, and be solderable or be coated with a solderable material, such as one of the coatings described below. A layer of flexible adhesive 111 is deposited on the metal foil, such as by screen printing, stenciling, paste draw down, or by laminating a sheet of dried or B-staged adhesive thereto, or other suitable method, typically having a thickness of about 50–250 μm (about 2–10 mils). Adhesive layer 111 has via holes therethrough defined by the screen, stencil or other printing process or formed by laser drilling, mechanical drilling, mechanical punching, die cutting, photo-etching, plasma etching or other suitable method, in locations corresponding to the locations of the contacts of the semiconductor chip 120 to be attached to interposer 110. Mechanical punching, die cutting and screen printing are preferably employed to form via holes having a diameter of about 100 μm (about 4 mils) or larger, and printing, photo-etching, plasma etching and laser drilling are preferably employed to form via holes having a diameter less than about 100 μm (about 4 mils). Such via hole formation by mechanical means is preferably done in sheets or films of dried or B-staged flexible adhesives prior to their being laminated to the metal foil, and relational alignment holes are also preferably formed therein to provide for alignment of the sheet of flexible adhesive relative to the stencils, screens, masks and other layers typically utilized in later processing operations, such as etching and other masked operations. Where the via holes are formed by plasma etching of flexible adhesive layer 111, the metal etch-defining mask may be temporarily attached to, but kept separated from, the flexible adhesive layer 111 by a thin layer of grease or a suitable low temperature adhesive, such as type MB7060 low-melt-flow temperature adhesive available from AI Technology which releases at a temperature of about 60° C. The separation provided by the grease or low-temperature adhesive is beneficial to reduce or avoid heating flexible adhesive layer 111 caused by either the plasma etching or by heating the temporary adhesive to remove of the metal etching mask, which heating of flexible adhesive layer 111 could undesirably cause curing or partial curing thereof.

Preferred flexible adhesives for layer 111 of flexible adhesive interposer include types ESP7450 and UVS7450 available from AI Technology which have the characteristics and properties set forth in the table below:

| Characeristic or Parameter | Limit Value | ESP7450 Adhesive | UVS7450 Adhesive |
|---|---|---|---|
| Dielectric Constant | <6.0 | <4.0 | <4.0 |
| Dielectric Loss | <0.1 @ >60 Hz. | <0.05 | <0.05 |
| Dielectric Strength | >19,700 V/mm (>500 V/mil) | >29,600 V/mm (>750 V/mil) | >29,600 V/mm (>750 V/mil) |
| Modulus of Elasticity | <70,000 kg/cm$^2$ (<500,000 psi) | 1,400 kg/cm$^2$ (20,000 psi) | 1,400 kg/cm$^2$ (20,000 psi) |
| Elongation Before Failure | >30% | 100% @ 25° C. | 100% @ 25° C. |
| Glass Transition Temperature | <0° C. | <−20° C. | <−20° C. |
| Adhesion to Copper (ASTM #D1894) | >1.07 dyne/cm (>6.0 lb/in.) | >1.43 dyne/cm (>8.0 lb/in.) | >1.43 dyne/cm (>8.0 lb/in.) |
| Moisture Absorption | <0.5% | <0.5% | <0.5% |
| Chemical Resistance (copper-etching solutions) | Pass | Passes, soaking for 8 hours | Pass, soaking for 8 hours |
| Solvent Resistance (flux cleaning operations) | Pass | Passes, soaking for 8 hours | Pass, soaking for 8 hours |
| Thermal Stability and Degradation TGA | <10% weight loss @ >300° C. | <10% weight loss @ >400° C. | <10% weight loss @ >400° C. |
| Coefficient of Thermal Expansion | | 100 ppm/° C. | 100 ppm/° C. |

Although a dielectric strength of about 19,700 V/mm (about 500 V/mil) is preferred, only about 11,800 V/mm (about 300 V/mil) is necessary for operability.

Adhesive layer 111 is B-staged and/or cured sufficiently (i.e. partially or fully) to remain attached to the metal foil and remain unaffected by (1) the etching chemicals and solvents utilized thereafter, whether acidic or basic, to etch the pattern of conductors 113 and contacts 114 into the metal foil, and to apply, develop and strip the photo-resists utilized to define the patterns to be etched in the metal foil, and (2) the plating of metal or the deposition of flexible conductive adhesive to fill the via holes of flexible adhesive layer 111 with conductive vias 124. The via holes are filled with conductive material by a building-up process by plating metal into the via holes to form conductive vias 112 that substantially fill the via holes, preferably by plating the same metal as the metal foil (e.g., copper or a copper-based alloy) into the via holes to form conductive vias 112, or alternatively by depositing an electrically-conductive composition such as a conductive adhesive, e.g., a flexible conductive adhesive filled with silver or other suitable conductive particles, such as type PSS8150 adhesive available from AI Technology, into the via holes.

It is preferred that such electrically-conductive flexible adhesive have a modulus of elasticity that is in the same range as that of the flexible dielectric adhesive of layer 111.

For example, the modulus of elasticity of either one of the adhesives preferably does not exceed three to five times the modulus of elasticity of the other one of the adhesives. Any spillage or excess of conductive adhesive on the surface of dielectric adhesive layer 111 outside of via conductors 112 is wiped off. Flexible conductive adhesives such as type PSS8150 thermosetting adhesive, and types ME8155, ME8650-XT, ESP8450 and ESP8550 thermosetting adhesives, all available from AI Technology, do not affect the types ESP7450 and UVS7450 thermosetting dielectric adhesives utilized for dielectric layer 111. It is preferred that the exposed metal of metal layer 113 at the bottoms of the via holes be coated e.g., by plating, with a suitable oxidation-resistant metal, such as nickel-gold, gold, palladium, and the like, prior to filing the via holes with conductive adhesive. It is noted that the metal foil layer 113 may be patterned either before or after the forming of the conductive vias 112.

Patterning of the metal foil layer 113 is by conventional photo-etching processes to create either contacts 114 overlying conductive vias 112, contacts 114 displaced from conductive vias 112 and joined thereto by conductors 113, or both. Because at least an about 2:1 ratio of the width of an etched feature to the thickness of the metal foil is typically desired, thinner metal foils 113 permit finer contacts and conductors to be obtained. For example, about 50 $\mu$m (about 2 mil) wide features and pitch may be obtained with a 25 $\mu$m (about 1 mil) thick copper foil. An coating may be applied metal foil 113 and conductive vias 112, such as a layer of silver, gold, nickel, palladium, nickel-gold, nickel-palladium, or other precious metal, or other combinations or alloys thereof, such as by plating, to reduce oxidation, metal migration, and/or inter-metallic degradation. Nickel-gold and nickel-palladium plated coating are preferred for conductive vias 112 and contacts 114, with a thickness of about 5 $\mu$m nickel covered by a thickness of about 0.1 $\mu$m gold or palladium, particularly when connections 124 and 134, respectively, are flexible electrically-conductive adhesive.

After the patterning of contacts 114 and conductors 113, conductors 113 may be covered by a layer of flexible dielectric adhesive to prevent unintended electrical contact thereto, e.g., such as by solder bridging. The flexible dielectric adhesive may be the same adhesive employed for flexible adhesive layer 111 or may be another type, such as a flexible photo-polymer that can be patterned and partially removed. The pattern of contacts 114 are conveniently not covered where such flexible dielectric adhesive is deposited by screen printing, stenciling or other method allowing for patterned deposition. Although in many cases the patterns of contacts on electronic device 120 and on next-level substrate 140 are predetermined and so the pattern of conductive vias 112, contacts 114, conductors 113 must be adapted thereto, the arrangement of contacts 114 and conductors 113 may simplified where there is the ability to define the respective patterns of contacts on electronic device 120 and on next-level substrate 140.

Figure 13A:
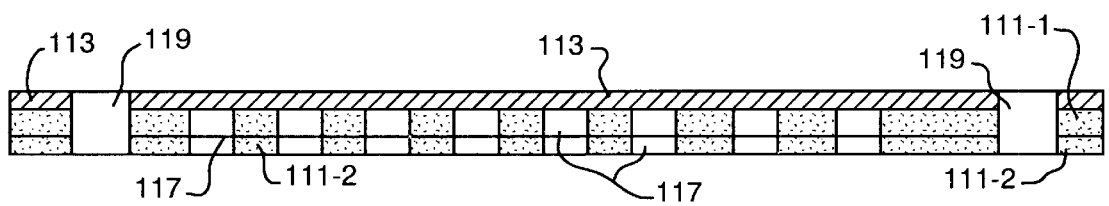
FIGS. 13A, 13B and 13C are side cross-sectional diagrams illustrating the fabrication of an interposer of the sort described in relation to FIGS. 3–12.
Figure 13B:
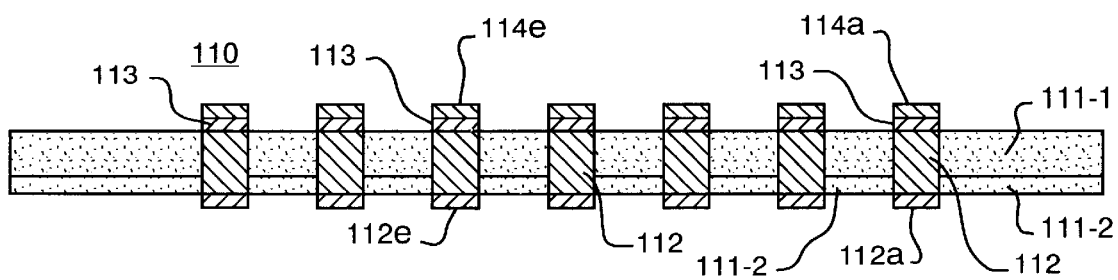
Figure 13C:
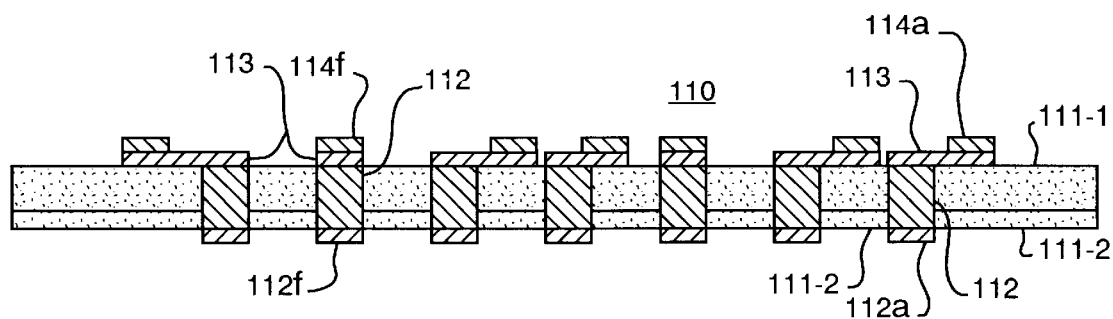

FIGS. 13A, 13B and 13C are side cross-sectional diagrams illustrating the fabrication of an interposer 110 of the sort described in relation to FIGS. 3–12.

FIG. 13A shows a metal sheet or foil 113 that is provided with at least two relational alignment holes 119 that are utilized to align the various stencils or masks, or the various other layers with metal foil 113 during fabrication of a flexible adhesive interposer 110. Where flexible adhesive layer 111 is applied to metal foil 113 by stenciling or screen printing or the like, the masks, stencils and screens therefor each include a like set of relational alignment holes that are aligned with relational alignment holes 119 of metal foil 113, for example, by alignment pins passing therethrough. The masks, stencils and/or screens employed in the deposition of flexible adhesive to form flexible adhesive layers 111-1, 111-2 define via holes 117 therethrough. Where additional thickness of flexible adhesive is desired, a second deposition is made after drying or B-staging flexible adhesive layer 111-1 to form flexible adhesive layer 111-2 having the same pattern and via holes as does layer 111-1.

Where flexible adhesive layer 111-1 is a thin sheet or membrane of dried, B-staged or partially-cured flexible dielectric adhesive that is laminated to metal foil 113, such thin sheet or membrane may have via holes 117 already formed therethrough, such as by drilling, punching, die cutting, laser cutting or the like, or via holes 117 may be formed after lamination, such as by laser cutting or laser drilling. Thin sheet 111-1 beneficially include a set of relational alignment holes corresponding to those of metal foil 113 for alignment therewith, such as by alignment pins.

Conductive vias 112 are formed in via holes 117 preferably by plating metal onto the back side of metal foil 113 exposed therein to substantially fill via holes 117, as illustrated in FIGS. 13B and 13C. The plated conductive vias 112 are preferably of the same metal as is metal foil 113, preferably copper or a copper alloy. Metal foil 113 is patterned, for example, by conventional photo-etching, to define conductors and contacts 113. Preferably, an oxidation-resistant layer 112$a$–112$f$ and 114$a$–114$f$ is deposited onto conductive vias 112 and conductors and contacts 113, either prior to or subsequent to the patterning of metal foil 113, but preferably subsequent thereto. Silver, gold, tin, nickel, nickel-gold, nickel-palladium and other oxidation resistant metals may be deposited, preferably by plating, so as to provide suitable solderability and/or bonding to electrically-conductive adhesives. Depending upon the pattern formed in metal foil 113, the electrically-conductive connections formed through flexible adhesive interposer 110 may be "straight-through" connections as illustrated in FIG. 13B, or may provide "fan out" or redistribution of the contact pattern as illustrated in FIG. 13C and as is convenient where the dimension and pitch of the contacts of electronic device 120 are too fine to permit straight-through connection to conventional electronic substrates 140.

Alternatively, dielectric layer 111' of flexible adhesive interposer 110 may be formed of a sheet of a high-temperature dielectric material, for example, a conventional dielectric substrate material such as FR4, polyimide, polyester, surface-modified tetrafluoroethylene (TFE), polyphenylene sulfide, and the like, which could lead to easier acceptance due to the established physical characteristics of such materials and their known dimensional stability and accuracy, where the smallest dimension of conductive vias 112 are sufficiently large, for example, at least 100 $\mu$m (about 4 mils). It is noted that the advantage provided by the intrinsic or molecular flexibility of flexible adhesive layer 111 remains effective as described above even where a thin high-temperature conventional dielectric layer 111' is also employed. In such case, the sheet of high-temperature dielectric material could have a set of relational guide holes matching those of metal foil 113 for proper alignment and via holes precut therein. Substrate 111' may have conventional metal conductors thereon for providing fan-out connections and the like.

Figure 14A:
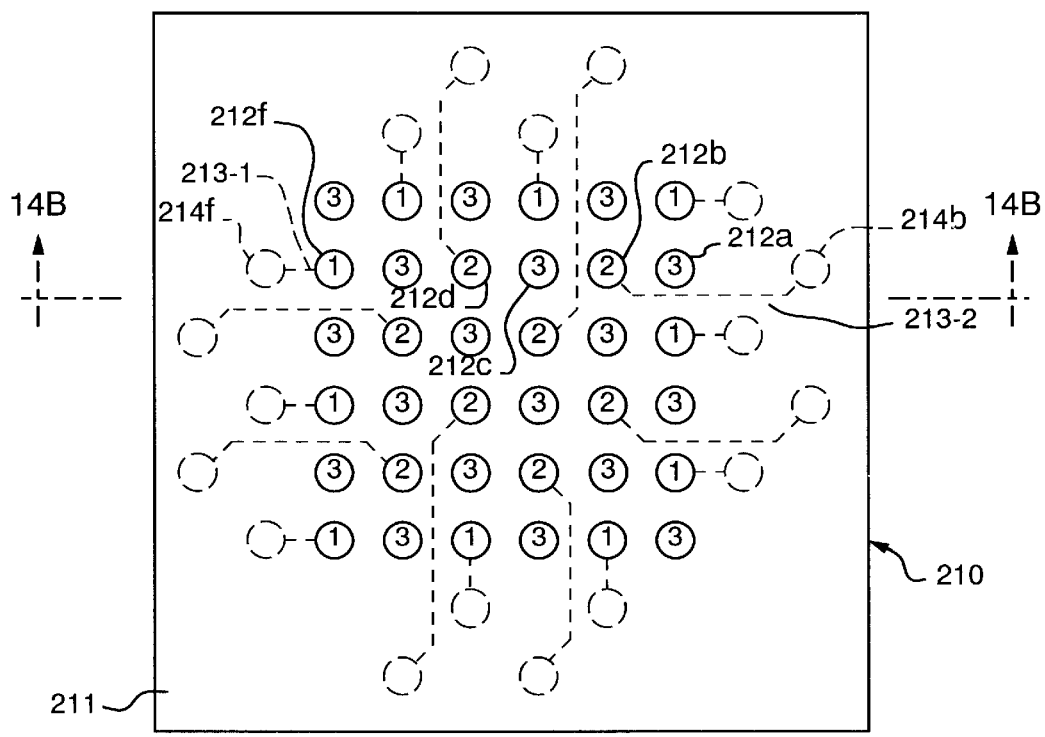
FIGS. 14A and 14B are plan and cross-sectional views, respectively, of an interposer in accordance with the present invention and employing plural layers of dielectric material.

FIG. 14A is a plan view of an alternative embodiment of a flexible adhesive interposer 210 relating to the present invention and employing plural layers of flexible dielectric adhesive 211. A 6×6 array of contacts 212 on the "top"

surface thereof (the surface visible in FIG. 14A) are indicated by solid circles enclosing a number 1, 2 or 3 that indicates the number of layers of flexible dielectric adhesive 211 that the conductive via directly therebelow passes through on a "straight-through" basis. The 6×6 array of contacts 212 are to connect, for example, to the corresponding array of closely-spaced fine-pitch contacts on a 36-contact electronic device such as a semiconductor chip or other electronic component. A fanned-out array of contacts 214 on the bottom or opposing surface of flexible adhesive interposer 210 is indicated by dashed circles, each one connected to a corresponding one of contacts 212 by an electrical conductor indicated by a dashed line 213. The array of contacts 214 are to connect, for example, to a next-level electronic substrate (not shown). By way of notation, lower-case letter suffixes a–f designate rows of contacts of the 6×6 array of contacts, and numerical suffixes indicate the number of layers of flexible adhesive above the item so designated. For example, conductor 213-1 is between the first and second adhesive layers 211-1 and 211-2, respectively. Contacts 212 and 214 typically represent the oxidation-resistant metal coating, such as nickel-gold or nickel-palladium, on conductive vias 212.

Figure 14B:
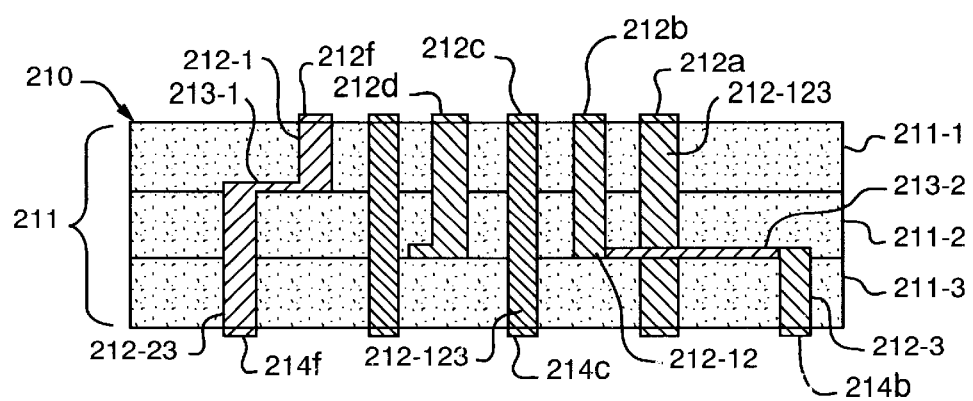

FIG. 14B is a cross-sectional view of the flexible adhesive interposer of FIG. 14A particularly showing the use of plural layers 211-1, 211-2, 211-3 of dielectric material. The exemplary conductive connection between contact 212a and 214a is provided by a conductive via 212-123 which passes straight through first, second and third flexible adhesive layers 212-1, 212-2, 211-3, respectively. The exemplary conductive connection between contact 212b and 214b is provided by a conductive via 212-12 which passes straight through first and second flexible adhesive layers 212-1, 212-2, by a conductor 213-2 located at the interface between the second and third flexible adhesive layers 211-2 and 211-3, and by a conductive via 212-3 which passes straight through third flexible adhesive layer 211-3. The exemplary conductive connection between contact 212f and 214f is provided by a conductive via 212-1 which passes straight through first flexible adhesive layer 212-1, by a conductor 213-1 located at the interface between the first and second flexible adhesive layers 211-1 and 211-2, and by a conductive via 212-23 which passes straight through second and third flexible adhesive layers 211-2 and 211-3.

In the embodiment of FIGS. 14A and 14B, conductive vias 212 may be plated-up metal or electrically-conductive adhesive, as described above. Conductors 213 may be electrically-conductive flexible adhesive that is suitable to be plated, such as type ESP8450 flexible conductive thermosetting adhesive available from AI Technology, or may be a plated metal conductor, such as of copper, nickel, silver, gold, nickel-gold, nickel-palladium and the like. Flexible dielectric adhesive layers 211-1, 211-2, 211-3 are of like flexible adhesives as described in relation to flexible adhesive interposers above.

In a typical fabrication sequence, flexible dielectric adhesive layer 211-1 is deposited with via holes therein on a metal layer or is laminated thereto. Via conductors 212-1 are plated up of the same metal as the metal layer, e.g., copper, in the via holes through flexible adhesive layer 211-1. Conductors 213-1 are deposited on flexible adhesive layer 211-1, and are dried or B-staged if of flexible conductive adhesive, and are plated. Flexible dielectric adhesive layer 211-2 is printed thereon with via holes therein, or may be laminated thereto. Via conductors 212-2 are plated up of the same metal as the metal layer in the via holes through flexible adhesive layer 211-2. Conductors 213-2 are deposited on flexible adhesive layer 211-2 and are dried or B-staged if of flexible conductive adhesive, and are plated. Flexible dielectric adhesive layer 211-3 is printed thereon with via holes therein, or may be laminated thereto. Via conductors 212-3 are plated up of the same metal as the metal layer in the via holes in flexible adhesive layer 211-3. The metal layer may be patterned at any convenient point in the foregoing process. Contacts 212a–212f and 214 are plated of an oxidation resistant metal as described above. To the extent via conductors 212 pass straight through one or more layers, they may be plated up through one or more layers at a time, as may be convenient. It is noted that plural-layered flexible adhesive interposers similar to interposer 210 may include greater or lesser numbers of layers 211-1, 211-2 and so forth, of flexible adhesive and may include other arrangements and/or patterns of contacts 212a, 212b . . . 214a, 214b . . . , conductive vias 212 and conductors 213 as may be desirable or convenient in a particular application.

Figure 15A:
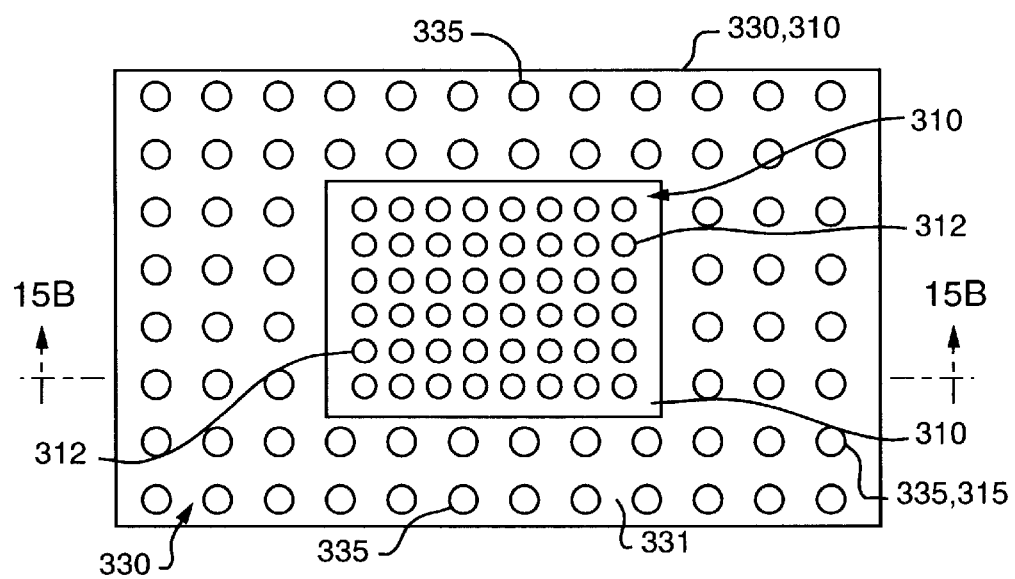
FIGS. 15A and 15B are plan and cross-sectional views, respectively of an exemplary arrangement of plural interposers in accordance with the present invention useful for stacking of packages for electronic devices.
Figure 15B:
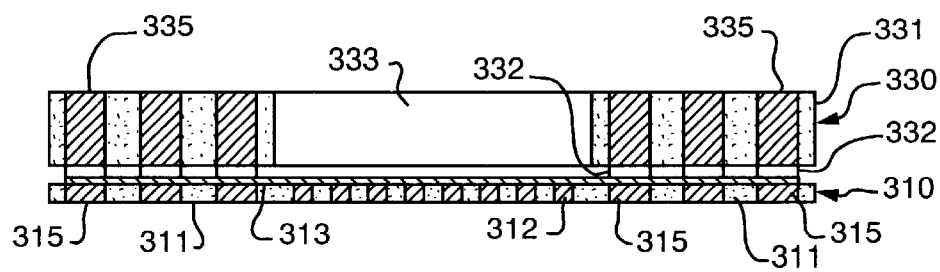

FIG. 15A is a plan view and FIG. 15B is a cross-sectional view of an exemplary arrangement of plural stacked interposers 310, 330 in accordance with the present invention which are useful for the stacking of packages for electronic devices. In FIG. 15A, a central portion of flexible adhesive interposer 310 is visible through a central opening or cavity 333 of flexible adhesive interposer 330. Flexible adhesive interposer 310 is rectangular and has an array of straight-through conductive vias 312, 315 thereon each with a contact at each end, as provided by a deposit of oxidation-resistant metal, for example. Flexible adhesive interposers 310, 330 include respective layers 311, 331 of flexible dielectric adhesive, a metal foil layer and conductive vias 312, 315, 335, and oxidation-resistant contact coatings, respectively, formed in like manner and with like materials to those described in relation to flexible adhesive interposers 110, 210 and so forth hereinabove. As is described below, flexible adhesive interposer 330 is a collar arrangement that interconnects and spaces apart two planar flexible adhesive interposers 310 as part of a stack of such interposers that contains various or like electronic devices located in the central cavities of the respective collar-type flexible adhesive collar interposers 330 thereof.

Contacts/conductive vias 312, 315 of flexible adhesive interposer 310 comprise a centrally-located 6×8 array of 48 contacts/vias 312 intended to connect to a like array of contacts of an electronic device such as a semiconductor chip or other electronic component, and a peripherally-located array of 72 contacts/vias 315 intended to connect to contiguous flexible adhesive interposers located above and below interposer 310 in a stack of like interposers. In general, but not necessarily, the size and pitch (center-to-center spacing) of the contacts/vias 312 are smaller than are the size and pitch of the contacts/vias 315, as is illustrated in the exemplary embodiment of FIG. 15B. Typically, contacts/vias 315 may be arranged and spaced to conform to a de facto or other standard contact layout such as may be specified by a standards organization or a manufacturer. Ones of contacts/vias 312 electrically connect to particular ones of contact/vias 315 through conductors 313 which are formed by patterning a metal layer as described above in relation to FIGS. 3–13, for example. Thus, flexible adhesive interposer 310 is substantially the same as previously described flexible adhesive interposers 110 and the like, in form and function, if different in details such as size and contact count and arrangement.

Flexible adhesive interposer 330 has a peripherally-located array of 72 straight-through contacts/vias 335 surrounding central cavity 333 in which an electronic device such as a semiconductor chip or other electronic component may be mounted. Contacts/vias 335 are in one-to-one correspondence with the 72 straight-through contacts/vias 315 of flexible adhesive interposer 310. Ones of contacts/vias 315 electrically connect to the corresponding ones of contacts/vias 335 of stacked interposers 310,330 by connections 332 which may be of solder or of electrically-conductive adhesive, as may be appreciated form the cross-sectional view of FIG. 15B, for example. contacts of one or more electronic devices are connected, typically by solder, to contact/vias 312 and are positioned within cavity 333 of flexible adhesive collar 330. It is noted that only 48 of contacts/vias 315, 335 are necessary to connect to the 48 contacts/vias 312 to which an electronic device connects, the remaining 24 contacts may be utilized for alternative routing of signals or for through routing of electrical signals or other functions as may be necessary, desirable or convenient.

In a typical arrangement according to FIGS. 15A and 15B, flexible interposer 310 is about 50–150 $\mu$m (about 2–6 mils) thick and flexible interposer 330 is the same thickness or slightly thicker than is the electronic device that will be mounted in cavity 333, typically about 50–750 $\mu$m (about 2–30 mils). Where electronic device 320 is connected by solder connections 324, or where connections 332, 334 are solder connections, the flexible dielectric adhesive material of interposers 310, 320 are selected to withstand the temperature necessary to melt solder, e.g., about 300° C. for about 5 minutes, i.e. for a time longer than the time needed to melt and reflow the solder connections, without substantial change to its characteristics that are important, e.g., less than a 50% change thereto.

Figure 16:
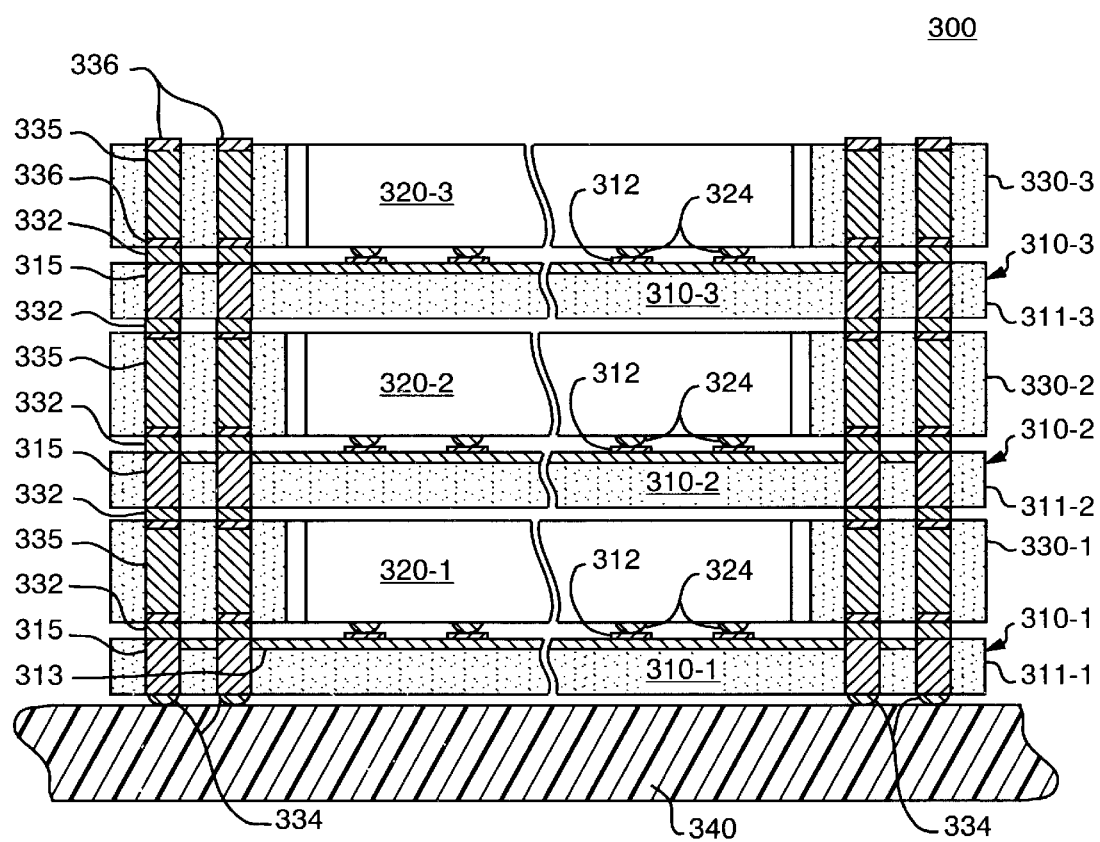
FIGS. 16 and 17 are cross-sectional views, respectively of alternative exemplary arrangements of stacked packages for electronic devices employing plural interposers in accordance with the present invention.

FIG. 16 is a cross-sectional view of an exemplary arrangement of a stacked package 300 for plural electronic devices 320 employing plural flexible adhesive interposers 310, 330 in accordance with the present invention. In the first layer of package 300, planar flexible adhesive interposer 310-1 and collar flexible adhesive interposer 330-1, which are as described above in relation to FIGS. 15A and 15B, have electronic device 330-1 mounted in cavity 333-1 thereof. Planar interposer 310-1 is preferably attached to collar interposer 330-1 by solder connections 332 prior to mounting of electronic component 320-1, but may be connected by suitable conductive adhesive. Contacts of electronic device 320-1 are connected to contacts 312 of flexible adhesive interposer 310-1 by connections 324, preferably of solder, but which may be of conductive adhesive.

In the second layer of package 300, as in the first layer thereof, planar flexible adhesive interposer 310-2 and collar flexible adhesive interposer 330-2, which are as described above in relation to FIGS. 15A and 15B, have electronic device 330-2 mounted in cavity 333-2 thereof. Planar interposer 310-2 is preferably attached to collar interposer 330-2 by solder connections 332 prior to mounting of electronic component 320-2, but may be connected by suitable conductive adhesive. Contacts of electronic device 320-2 are connected to contacts 312 of flexible adhesive interposer 310-2 by connections 324, preferably of solder, but which may be of conductive adhesive. The first and second layers of package 300 are attached together by electrical connections 332 between corresponding contacts of planar flexible interposer 310-2 and of collar flexible adhesive interposer 330-1.

In like manner, planar flexible adhesive interposer 310-3, collar flexible adhesive interposer 330-3 and electronic device 320-3, and are then attached by connections 332 to flexible interposer 330-2, to complete the exemplary three-layer stacked package 300. As described above, metal foil patterned conductors 313 and built up conductive vias 315, 335 of flexible adhesive interposers 310, 330, respectively, are preferably of copper or copper alloy and are coated, preferably with nickel and gold or nickel and palladium, to resist oxidation and improve solderability. It is noted that greater or lesser number of layers may be employed in such packages according to the present invention, and that the layers may all be assembled and thereafter be assembled into a stack or that layers may be assembled to each other as they are themselves assembled, as is convenient for assembly operations. In either case, the exposed interposers 310 and 330 at opposite ends of the stacked package 300 each have exposed solderable contacts 316, 336 at the ends of conductive vias 315, 335, respectively, that are suitable for attachment of additional layers of packaged electronic devices 320 or for attachment of package 300 to a next-level substrate 340.

Package 300 containing plural electronic devices 320 and plural flexible adhesive interposers 310, 330 alternatingly of the planar interposer 310 and of the collar interposer 330 type, is attached to a next-level substrate 340, such as a printed circuit wiring board, ceramic substrate or other substrate as is conventional. Electrical connection of package 300 to next-level substrate 340, as well as the mechanical attachment thereof, is provided by connections 334 which may be of solder or of conductive adhesive.

Figure 17:
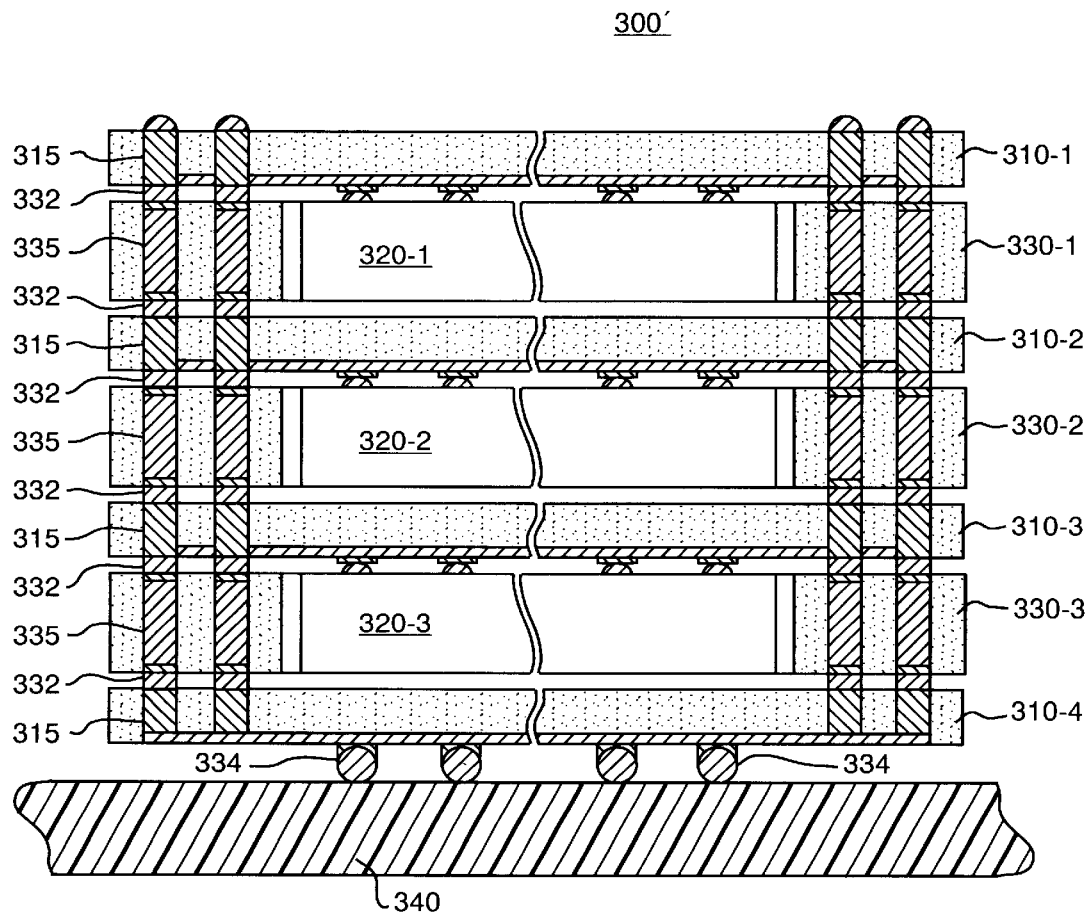

FIG. 17 is a cross-sectional view of an alternative exemplary arrangement 300' of the stacked package 300 for plural electronic devices of FIG. 16. In stacked package 300', stacked package 300 is inverted and contacts 336 of flexible adhesive interposer 330-3 are connected by connections 332, preferably of solder, but also of conductive adhesive, to planar flexible adhesive interposer 330-4. The exposed face of planar interposer 310-4 has a pattern of contacts thereon that may be the same as the pattern of contacts of any one or more of planar interposers 310-1, 310-2, 310-3, or that may be different therefrom, e.g., redistributed by a pattern of conductors formed of a metal foil as described above. These contacts are utilized to attach package 330' to next-level substrate 340 through connections 334 which may be of solder or of conductive adhesive. Optionally, packages 300 and 300' may be encapsulated in an encapsulating material (not shown), such as type MEE7650-5 flexible dielectric adhesive available from AI Technology. Alternatively, annular collar interposers 330-1, 330-2, 330-3 could be formed of a conventional printed wiring board material, particularly where the arrangement thereof is simple, although a flexible adhesive material as described above is preferred.

Figure 18:
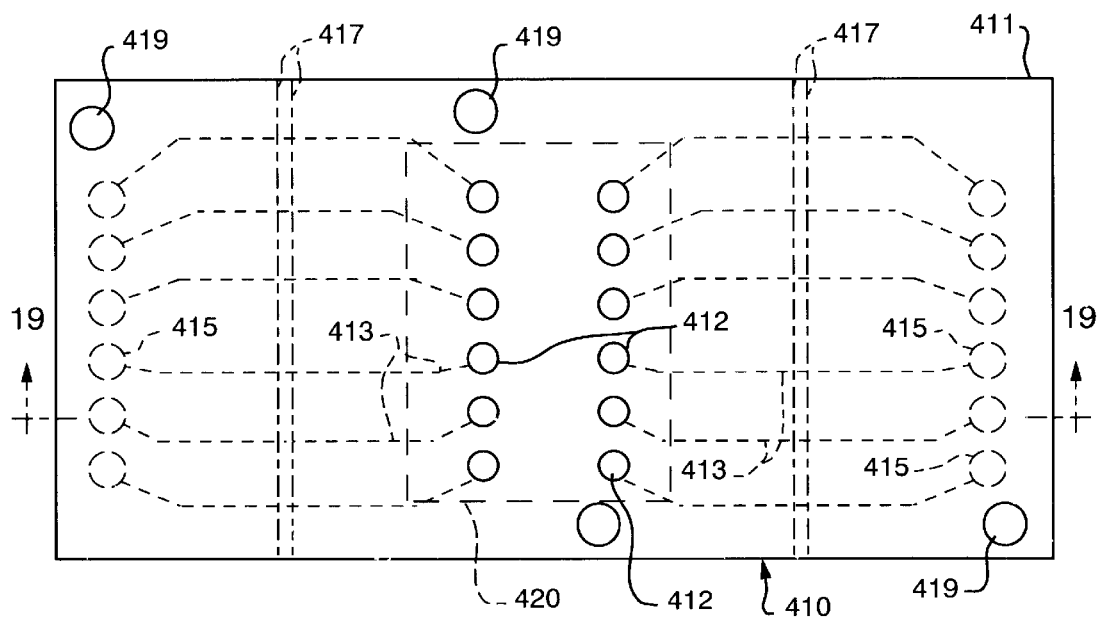
FIGS. 18 and 19 are a plan view and a side cross-sectional view, respectively, of an embodiment of a foldable flexible interposer in accordance with the present invention.
Figure 19:
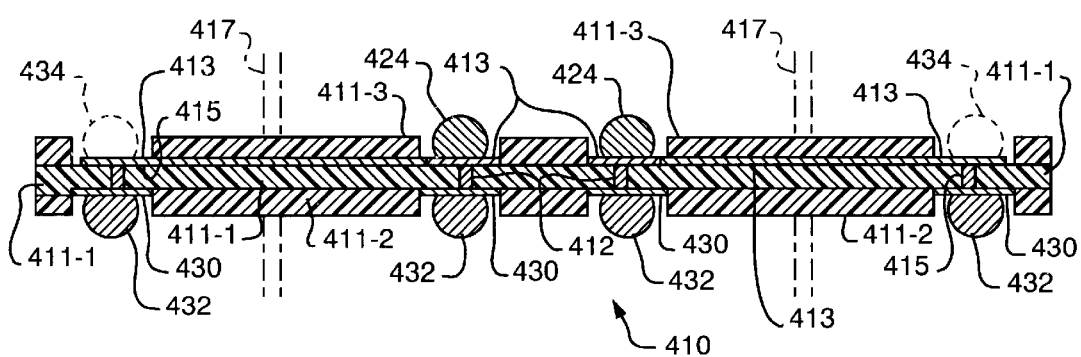

FIGS. 18 and 19 are a plan view and a side cross-sectional view, respectively, of an embodiment of a foldable flexible interposer 410 in accordance with the present invention. Foldable flexible adhesive interposer 410 comprises at least one layer 411 of a flexible dielectric adhesive having plural conductive vias 412, 415 therethrough and patterned electrical conductors 413, e.g., of metal foil, on one surface thereof, as described herein. In particular, conductive vias 412, 415 are built up (such as by plating of metal) in flexible adhesive layer 411-1 and metal foil conductors 413 are on one surface thereof, A metal layer 430 is formed over vias 412, 415, for example, so as to provide a contact that is suitable for soldering, and preferably includes a layer of an oxidation-resistant metal such as a precious metal, for example, gold over nickel or palladium over nickel. Conductive vias 412 located in a central region of flexible interposer 410 are in a pattern corresponding to the pattern of contact pads of an electronic device 420 to be connected thereto. In FIG. 18, electronic device 420 is shown in phantom to indicate its position with respect to flexible interposer 410.

Solder balls or bumps 424 are formed in conventional manner on the a contact portion of patterned conductors 413 for connecting to electronic device 420 and solder balls 432 are likewise formed on plated contacts 430 for connecting to external contacts, such as those of another device or a substrate, most commonly, another electronic device or another similar interposer, as is described below. Preferably, additional layers 411-2, 411-3 of flexible dielectric adhesive, preferably of the same type as that of layer 411-1, are formed one on each side of layer 411-1 to provide additional thickness to flexible adhesive interposer 410 as well as to provide an electrically-insulating cover of patterned conductors 413 other than at locations at which connections are to be made thereto.

Fold lines 417 are shown in FIGS. 18 and 19 in relation to flexible interposer 410 to indicate where it is to be folded around an electronic device 420 connected to contacts at conductive vias 412 thereof. Fold lines 417 are imaginary lines and do not represent a physical feature of flexible interposer 410 (although there is no reason why a physical line or indentation could not be utilized, if desired, to indicate the location of the folds). Because the flexible adhesive has an elongation of at least 30% before failure, and the exemplary types described herein have an elongation of 100% or more before failure, flexible interposer 410 is easily folded (as indicated by the arrows labeled "FOLD") around an electronic device without the need for physical fold-line features and with smaller radii for a given thickness of interposer than is obtained with conventional so-called flexible materials such as polyimide, polyester, and the like. Two fold lines 417 are shown in each place to indicate that dimension has been allowed in flexible interposer to accommodate the thickness of the electronic device 420.

A pattern of at least two relational alignment holes 419 may be utilized, if desired, to properly align and register the stencils, screens and masks that may be utilized in depositing the layers 411 of flexible adhesive, the patterning of metal foil 413, and in depositing the solder paste that is reflowed to form solder balls 424, 232, 434. Alignment holes 419 are also useful, either alone or in conjunction with visual fiducial marks, in positioning and aligning an unfolded flexible interposer 410, or a panel or strip of flexible interposers 410, for placement of electronic components 420 thereon using automated component placement apparatus, such as conventional surface mount technology (SMT) pick-and-place equipment, flip-chip bonders, and the like. It is noted that where the folded ends of flexible interposer 410 are to connect to the contacts of the electronic device 420 enclosed thereby, solder balls 434 are formed in place of solder balls 424.

Figure 20:
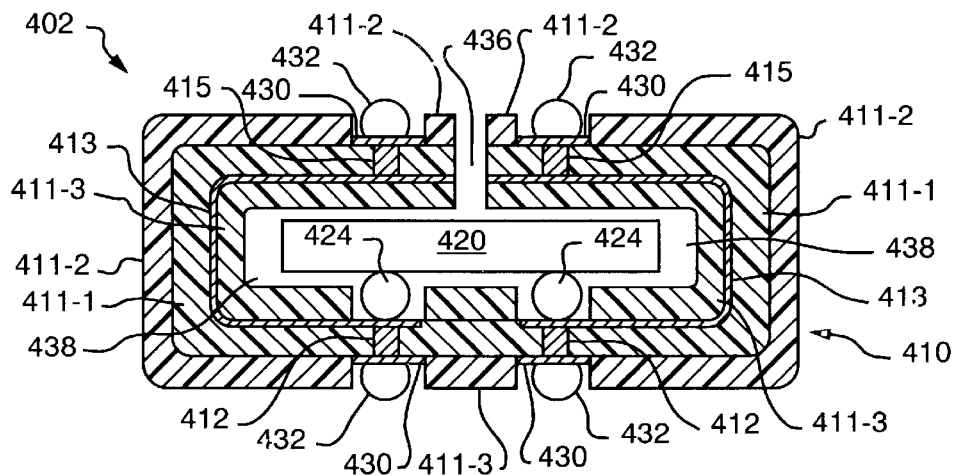
FIG. 20 is a side cross-sectional view of a package for an electronic device employing the foldable flexible interposer of FIGS. 18–19.

FIG. 20 is a side cross-sectional view of an exemplary package 402 for an electronic device 420 employing the foldable flexible interposer 410 as shown in FIGS. 18–19 folded around electronic device 420. Electronic device 420 is attached to flexible interposer 410 by positioning device 420 in the proper position against flexible interposer 410 with its contacts against corresponding ones of solder balls 424 and applying heat to reflow solder balls 424 to form solder connections between the contacts of device 410 and patterned conductors 413. Flexible interposer 410 is folded around or wrapped around electronic device 420 to locate conductive vias 415 and solder balls 432 in the proper location for contacting external contacts. The package 402 is heated to the melt flow temperature of the flexible adhesive of layer 411-3 and pressed together to attach the flexible adhesive 411 to device 420. Upon cooling if the flexible adhesive is a thermoplastic adhesive, or curing if the flexible adhesive 411 is a thermosetting adhesive, flexible interposer 410 and electronic device 420 are held in a fixed stable spatial relationship by flexible adhesive 411. The package 402 of FIG. 20 with electronic device 420 enfolded in flexible adhesive interposer 410 is then ready to be attached to one or more of another electronic device, to another similar package, or to a substrate such as a printed wiring circuit board.

It is noted that a gap 436 is preferably left between the extreme ends of flexible interposer 410 where they are close together after being folded, so as to allow for tolerances in fabrication of package 402. In addition, it is preferred that gaps remain at the sides of electronic device 420 where flexible interposer 410 folds around between the two major surfaces of device 420, for like reason. The gaps between the major surfaces (top and bottom) of device 420, however, are typically filled by the flowing of flexible adhesive layer 411-3.

Figure 21:
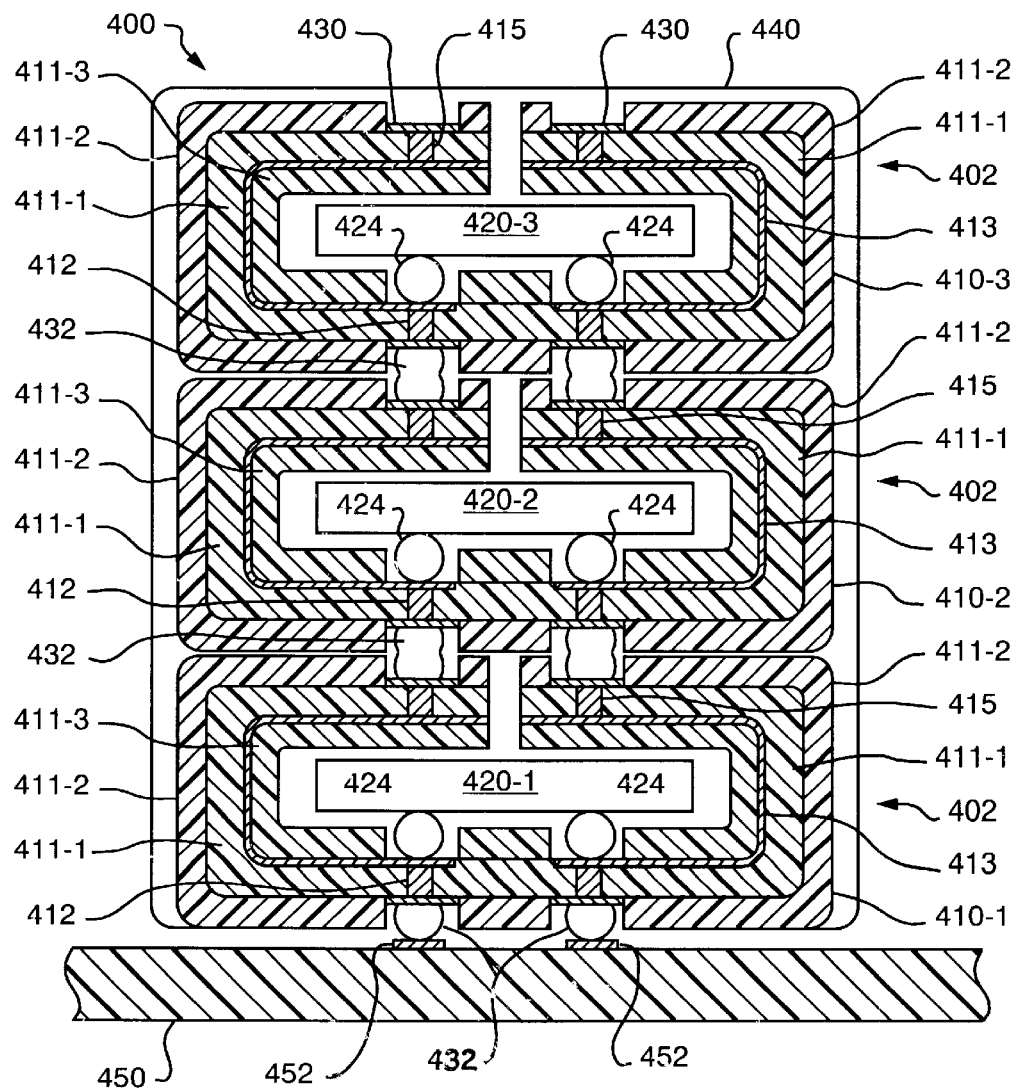
FIGS. 21, 22, 23 and 24 are cross-sectional views, respectively of alternative exemplary arrangements of stacked packages for electronic devices employing plural foldable flexible interposers in accordance with the present invention, such as of FIGS. 18–19.

FIG. 21 is a cross-sectional view of an exemplary arrangement of a stacked package 400 for electronic devices 420 employing plural foldable flexible interposers 410 as in FIGS. 18–19 folded with an electronic device 420 into a package 402 as in FIG. 20. Specifically, stacked package 400 comprises three packages 402 that are one upon the other thereby to include three electronic devices 420-1, 420-2, 420-3 in a single package 400, although a greater or lesser number of packages 402 can be stacked to include a like number of electronic devices 420. The electronic devices included in each package 402 may be the same or may be different, as is convenient for the electronic functioning of the circuitry that is packaged thereby. Package 400 is assembled, for example, by positioning two or more packages 402 with their respective corresponding solder balls 432 properly positioned and then applying heat to melt and reflow the solder to, upon cooling, form solder connections between the adjacent conductive vias 412 on one package 402 and the corresponding conductive via 415 on the immediately adjacent package 402. Such heating may also serve to melt flow the adhesive layers 411-3 to bond adjacent ones of packages 402 together.

Ultimately, the circuitry included in package 400 is connected to a substrate 450, such as a ceramic or FR4 laminate or other substrate, for utilization. In attaching stacked package 400 to substrate 450, package 400 is positioned with the exposed solder balls 432 of flexible interposer 410-1 against the corresponding contacts 452 of substrate 450 and applying heat to melt and reflow solder balls 432 to form solder connections between package 400 and substrate 450.

Optionally, the complete stacked package 400 may be encapsulated in a protective and/or encapsulating layer 440, preferably of like flexible adhesive as is utilized for layers 411. Also optionally, solder balls 432 may be omitted from contacts 430 overlying conductive vias 415 of flexible interposer 410 of the topmost package 402 because no connection is made thereto, however, it may be desirable to simplify inventory and assembly by simply making all of packages 402 alike. On the other hand, one or more of the flexible interposers 410 in one or more of the packages 402 in a stacked package 400 may be different, as may be one or more of the electronic devices 420 included therein.

Figure 22:
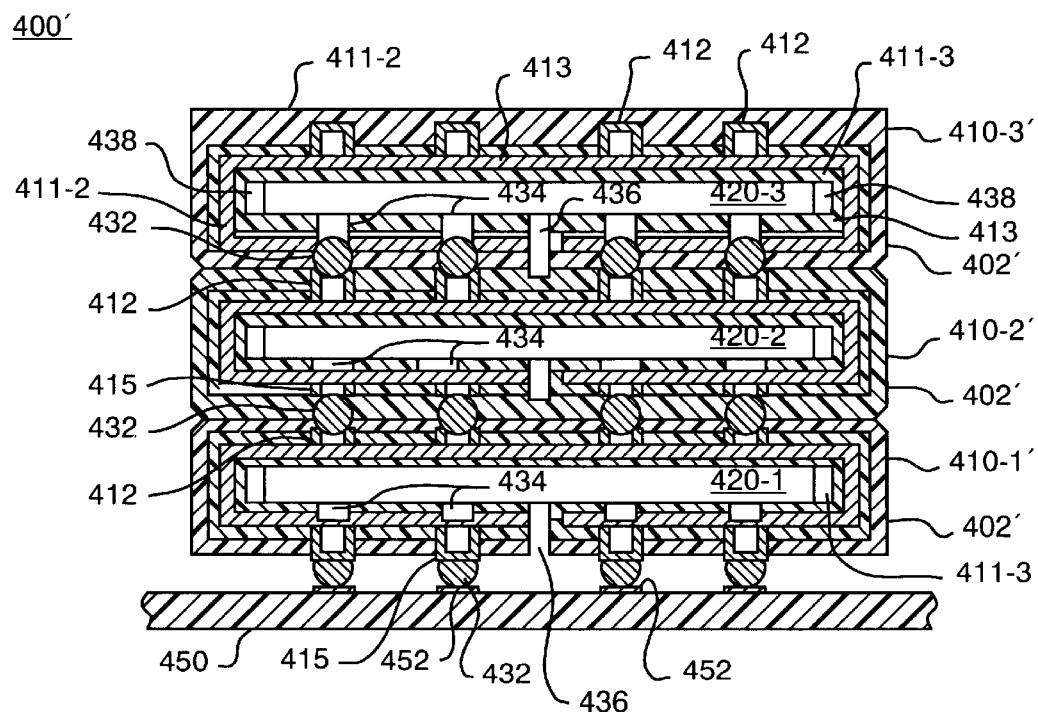

FIG. 22 is a cross-sectional view of an alternative exemplary arrangement of a stacked package 400' for electronic devices 420 employing plural packages 402' each having a foldable flexible interposer 410 as in FIGS. 18–19. Packages 402' differ from package 402 in that four connections 432 are visible between respective corresponding solderable contacts 430 on adjacent packages 402' and four connections 434 are visible between electronic devices 420 and the solderable contacts 413 of flexible interposer 410 associated therewith, and that the latter connections are made to locations of solder balls 434 overlying conductive vias 415 rather than solder balls 424 overlying conductive vias 412. As illustrated, three identical packages 402' are stacked together in like fashion to that described above, each having a flexible interposer 410 of the same size and conductor 413 pattern, with like patterns and pitch of conductive vias 412, 415, and so forth, with the outward facing contacts 430 of flexible interposer 410-3 of top package 402' not connected, and preferably covered with the same flexible adhesive as employed in interposer 410-3. Four solder connections 432 are visible connecting contacts 430 and conductive vias 415 of flexible interposer 410 to solderable contacts 452 of substrate 450.

Figure 23:
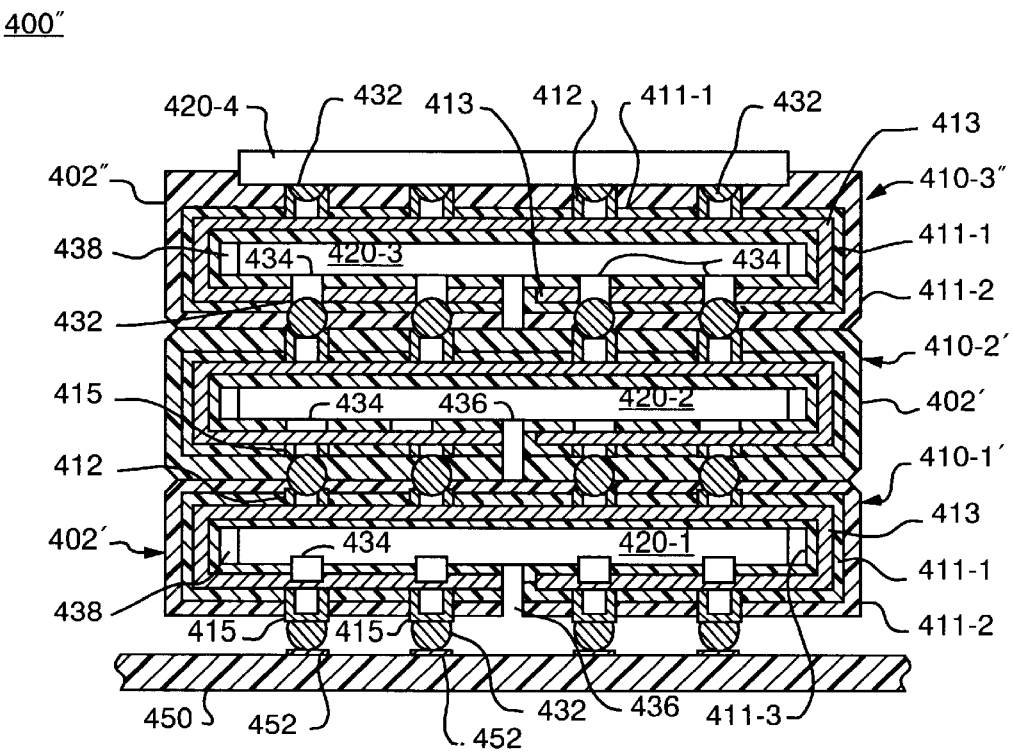

FIG. 23 is a cross-sectional of a further alternative exemplary arrangement of a stacked package 400" for plural electronic devices 420 employing plural folded packages 402', 402" each including a foldable flexible interposer 410 as in FIGS. 18–19. Stacked package 400" differs from stacked package 400" in that top package 402" differs from the other packages 402'. In package 402", outwardly-facing solderable contacts 430 overlying conductive vias 412 are utilized for attaching another electronic device 420-4 which may be of like or different kind from that of any of devices 420-1, 420-2, and 420-3. To that end, solder balls 432 on outwardly-facing contacts 430 form solder connections to corresponding contacts of electronic device 420-4 which is thus part of package 402", making package 402" different from any of the other packages 402, 402'. An advantage of this arrangement is that an integer number N+1 electronic devices 420 (e.g., N+1=four) are included in a stacked package 400" that includes only N packages 402, 402', 402" and only N flexible adhesive interposers (e.g., N=3).

The packages of FIGS. 20–23 and the flexible interposers of FIGS. 18–19 are beneficially employed with electronic devices having contacts in the conventional ball-grid array (BGA), area array or peripheral array contact patterns typically having contact pads of about 75 μm (about 3 mils) diameter spaced at a pitch of about 150 μm (about 6 mils) or greater. The contact patterns 430 of the flexible interposer 410-1 that becomes connected to an external substrate, such as substrate 450, typically conform to a recognized standard pattern of standardized contacts at a standardized pitch, such as specified by JEDEC Publication 95 or EIAJ-ED-7404, for example, and typically conform to the contact pattern of the electronic device 420, especially where plural identical devices 420, such as electronic memory chips, are stacked in a package 400, 400', or 400" to increase the size of the memory that is connected to a particular location on a substrate.450. Contacts 413, 430 of flexible interposer 410 are typically located over one of conductive vias 412, 415 and all are plated with an oxidation resistant and/or solderable layer for reliable electrical connection whether by soldering or by an electrically-conductive adhesive.

Also preferably, the flexible interposers 410 are formed as a panel or strip of interposers 410 for efficiently processing plural interposers 410, for example, for screening, stenciling, or laminating of the flexible adhesive layers 411 and the metal foil 413, for patterning of the metal foil 413, for plating up of conductive vias 412, 415, and for plating of the oxidation resistant and/or solderable layer, and possibly for the application of soldering flux. After plural flexible interposers 410 are formed in a panel or a strip, individual flexible interposers are cut or excised from the panel or strip for use. The thickness of each flexible adhesive layer 411 of flexible interposer 410 is preferably comparable to the height of the solder balls 424, 432, 434 to be formed, i.e. typically in the range of about 75–200 μm (about 3–8 mils), and more typically about 100–125 μm (about 4–5 mils).

Adhesives suitable for tacking and bonding interposer 410 in position relative to device 420 include flexible adhesives, i.e molecularly flexible adhesives having a modulus of elasticity that is less than about 35,000 kg/cm² (500,000 psi) as defined hereinabove, that preferably have characteristics similar to those of the flexible dielectric adhesive 411 of interposer 410. Suitable adhesives include, for example, types ESP7250 and ESP7450 flexible dielectric thermosetting adhesives available from AI Technology of Princeton, N.J., and low temperature coefficient adhesives having a CTE of less than about 30 ppm/°C., such as types ESP 7675 and ESP7685 low CTE thermosetting adhesives also available from AI Technology.

Figure 24:
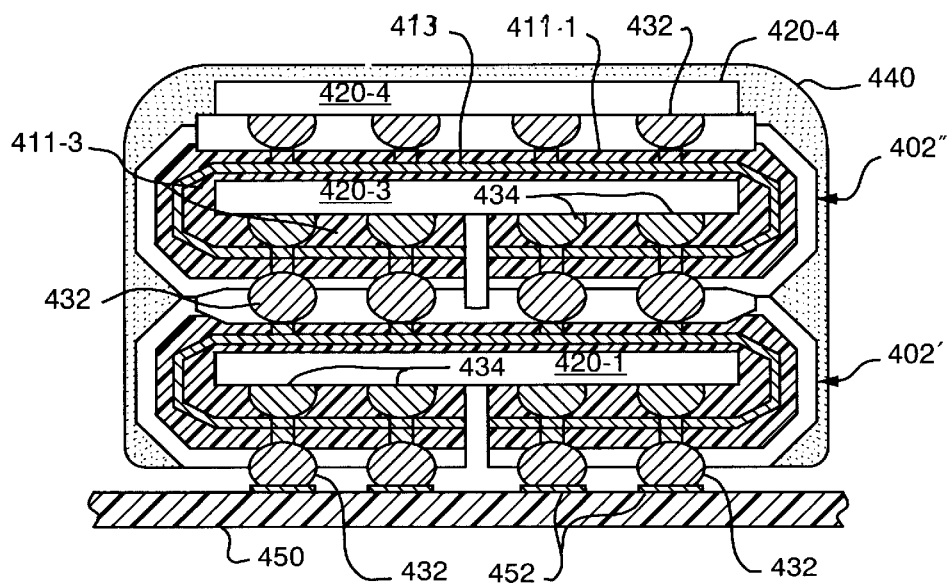

FIG. 24 is a cross-sectional view of a modification of the exemplary arrangement of a stacked package 400" of FIG. 23 including only two flexible interposers 410-1 and 410-3 in packages 402' and 402", respectively. The shape of flexible interposers 410 in the regions where they fold around the narrow ends of electronic devices 420 is shown rounded to be a more representative illustration of an actual package. Therein, N=2 flexible interposers 410-1, 410-3 are employed to package N+1=3 electronic devices 420-1, 420-3, 420-4. In addition, overall encapsulation 440 surrounds the individual packages 402', 402" for protection, as well as for aesthetic appearance.

Figure 25:
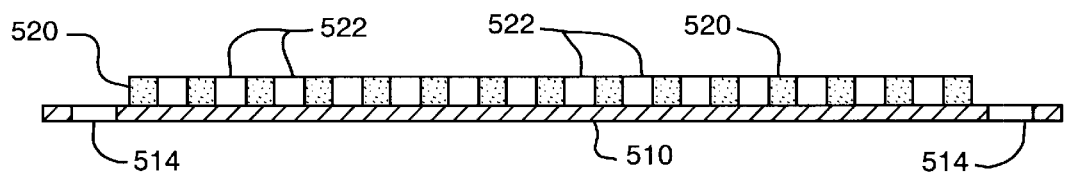
FIGS. 25–30, 25A, 25B, 27A and 28A are cross sectional views illustrating various stages in the fabrication of a flexible adhesive interposer in accordance with the present invention.

The above described flexible adhesive interposers may be fabricated in accordance with the method illustrated by FIGS. 25–30, and variations thereof as subsequently described below, for flexible adhesive interposers 500 having two or more layers of conductors formed of metal foil. A sheet of metal foil 510 is provided and preferably has two or more relational guide holes 514 in a pattern therein for aligning metal foil 510 with the various masks, screen, stencils, laminates and the like employed in a flexible adhesive interposer 500 and/or in the fabrication thereof. In FIG. 25, a first layer 520 of flexible dielectric adhesive is deposited at a suitable thickness or is laminated onto metal foil 510 and has a pattern of openings 522 therein in which conductive vias will later be formed. A deposited flexible adhesive layer 520 is B-staged or dried to the touch and ready for bonding, however, if an additional layer thereof is to be deposited thereon or laminated thereto, layer 520 is preferably cured. Metal foil 510 may be pre-coated with a patterned photoresist defining the pattern of conductors to later be formed therefrom, such as by photo-etching or other process, or such photoresist may be applied later in the processing.

Figure 26:
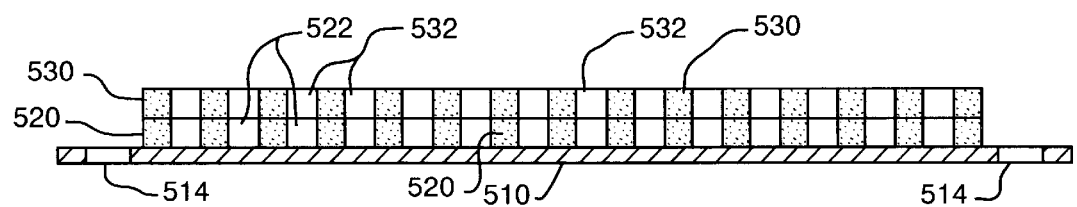

FIG. 26 shows a second layer 530 of like flexible dielectric adhesive deposited or laminated to flexible adhesive layer 520 which has been at least B-staged or dried, and preferably cured. A second layer 530 is employed if the thickness of the flexible dielectric adhesive is thicker than can be applied in a single deposition, i.e. two or more layers of flexible dielectric adhesive may be placed one upon the other to obtain any desired thickness of flexible adhesive. The second flexible adhesive layer 530 has a pattern of openings 532 therein that corresponds to the pattern of openings 522 of layer 520. The final layer of flexible adhesive, second layer 530 in the present example, is preferably B-staged or dried. It is noted that any number of layers of flexible dielectric adhesive may be deposited, each preferably being cured prior to the deposition of the next layer thereof, except that the topmost layer need only be B-staged or dried, thereby to obtain any desired thickness of flexible adhesive.

Figure 27:
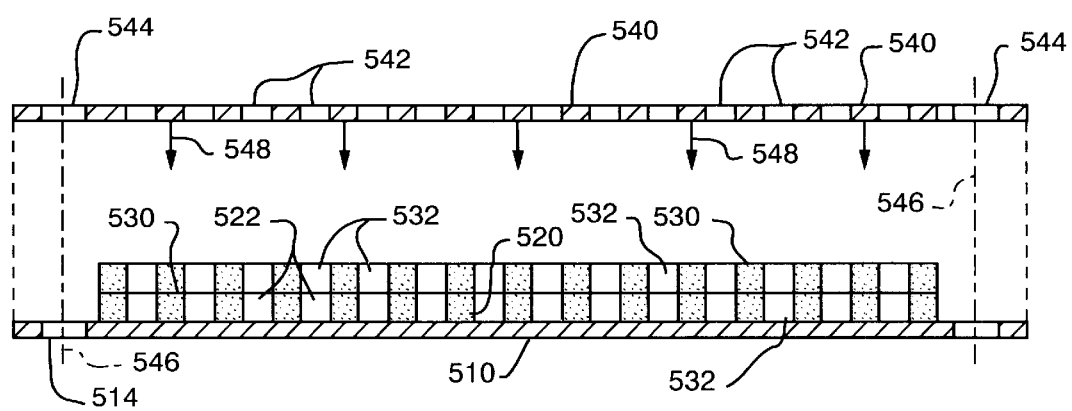

A second sheet of metal foil 540, shown in FIG. 27, is prepared having a pattern of openings 542 therein that correspond to the pattern of via openings 522, 532 in flexible adhesive layers 520, 530, and preferably having a pattern of relational guide holes 544 that likewise corresponds to the pattern of relational guide holes 514 of metal foil 510. Openings 542 and guide holes 544 may be formed by any convenient method including photo-etching using conventional photo-resists and chemical etching or other etching. Preferably, via openings 542 are slightly smaller than are via openings 522, 532, for example 5–50% smaller in diameter, and metal foil 510 may be pre-coated with a patterned photoresist defining the pattern of conductors to later be formed therefrom, such as by photo-etching or other process, or such photoresist may be applied later in the processing. Metal foil 540 is illustrated positioned proximate metal foil 510 and flexible adhesive layers 520, 530 thereon and is to be moved along centerline 546 in the direction indicated by arrows 548 until it contacts layer 530 and is attached thereto, such as by laminating metal foil 540 and B-staged adhesive layer 530 between heated rollers that heat them until the adhesive of layer 530 melts and press them together until the melted adhesive 530 flows to bond to metal foil 540, thereafter to cool or cure, producing the structure illustrated in FIG. 28.

Figure 29:
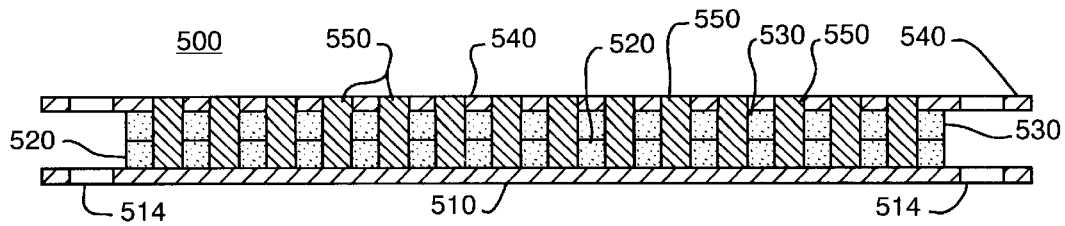

Via openings 522, 532, 542 are filled with conductive material to form conductive vias 550 as illustrated in FIG. 29. Conductive vias 550 are plated onto the side of metal foil 510 on which adhesive layers 520, 530 reside into via holes 522, 532, 542 and the plating builds up to fill vias holes 522, 532, 542 with conductive material 550. Preferably copper is electrolytically plated into via openings 522, 532, 542 until plating builds up to the level of metal foil 540 and complete electrical connections between metal foil 510 and metal foil 540. Once the plating of the via conductors 550 completes electrical connection between metal foils 510 and 540, there will be a thin layer of additional metal plated onto metal foil 540. Plating may be stopped at this condition wherein adequate joining of the two metal foils 410, 540 is made or may be continued to complete the filling of via openings 542. Where metal foil 540 is pre-coated with patterned photoresist, only the locations on metal foil 540 whereat openings 542 are located and the locations that will remain as photo-etched conductors will be built up with plated metal.

Metal foils 510, 540 are each patterned such as by photo-etching to define a pattern of conductors thereon, each conductor so formed typically connecting to at least one conductive via 550, thereby producing a flexible adhesive interposer 500 in accordance with the invention, substantially as illustrated in the exemplary embodiment of FIG. 29, and suitable for utilization in the embodiments of packages employing flexible adhesive interposers as described herein.

Figure 30:
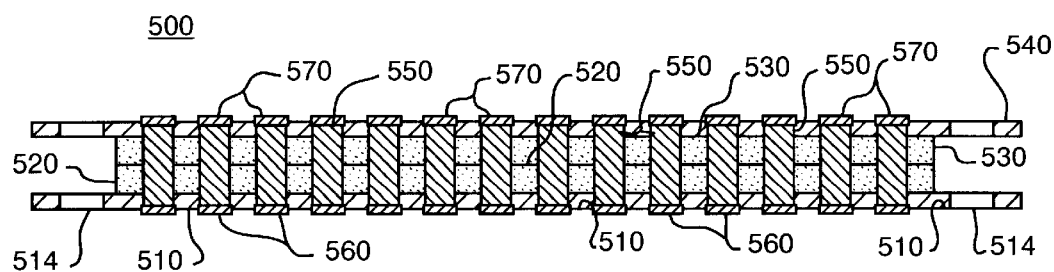

In addition, and preferably, at least the exposed ends of via conductors 550 are plated with an oxidation resistant metal, preferably nickel-gold or nickel-palladium layers 560, 570, as shown in FIG. 30. Therein, plated metal layer 570 is plated onto the exposed ends of via conductor 550 and plated metal layer is plated onto the exposed surface of metal foil 510 at locations at which via conductors 550 lie thereunder in flexible adhesive interposer 500. Further, and also preferably, the conductor patterns (printed circuit traces, not visible in Figure) etched from metal foils 510 and 540 are similarly plated with the oxidation resistant metallization. Alternatively, the oxidation resistant metallization layers 560, 570 may be applied onto foils 510, 540 in the pattern of the conductors that will remain after photo-etching, for example, using a patterned photo-resist, the metallization being so applied before metal foils 510, 540 are photo-etched to define conductor patterns.

It is noted that if additional layers of conductors are desired, additional layers of flexible dielectric adhesive may be deposited onto metal foil 540 and additional metal foil with via openings therein may be laminated to such additional adhesive layers in accordance with the method described above, thereby allowing flexible adhesive interposer 500 to include two, three, four or more patterned metal foil layers interconnected by conductive vias in a desired pattern. It is important to note that the patterns of conductive vias connecting adjacent sheets of metal foil may be different respecting each adjacent pair of metal foil layers, and that the patterns of conductors photo-etched in each metal foil may be different from the pattern etched in any other metal foil layer, thereby permitting a wide variety of different flexible adhesive interposers suitable for use in many different applications.

Copper or copper alloys are preferred for metal foils 510, 540. Type CC7450 flexible thermosetting dielectric adhesive available from AI Technology is suitable for flexible adhesive layers 520 and 530, which are typically deposited at a wet thickness of about 150–300 $\mu$m (about 6–12 mils) and typically about 225 $\mu$m (typically about 9 mils), which dries and/or cures to a typical thickness of about 150 $\mu$m (about 6 mils). Via openings 522, 532, 542 typically range between about 25 $\mu$m to 2.5 mm (about 1–100 mils) in diameter, with an about 300-$\mu$m (about 12-mil) diameter being typical for via openings 522, 532 and an about 250-$\mu$m (about 10-mil) diameter being typical for slightly smaller via openings 542. Metal foil 540 is laminated to flexible adhesive layer 530 at a temperature typically between 80° C. and 150° C. by heated rollers that apply heat and pressure.

Figure 27A:
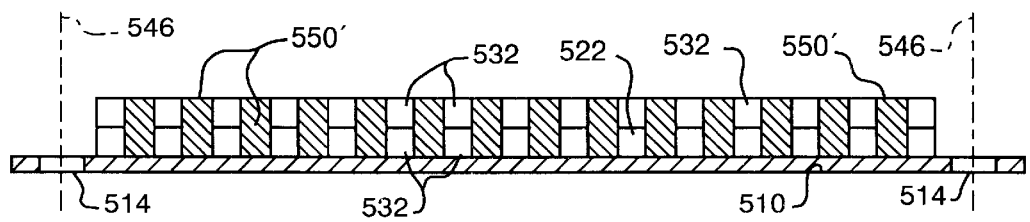
Figure 28:
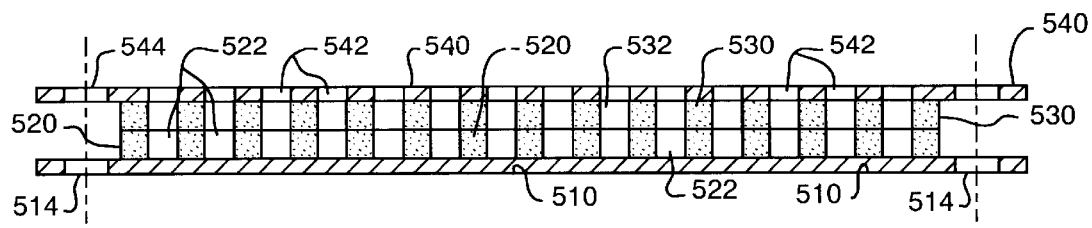
Figure 28A:
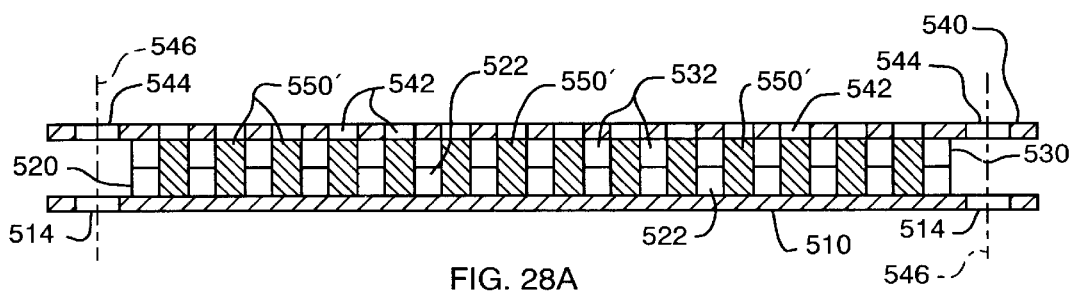

FIGS. 27A and 28A are cross-sectional views illustrating a variation of the method illustrated in FIGS. 25–30, and specifically as shown in FIGS. 27 and 28 thereof. In FIG. 27A, the method differs from that of FIG. 27 in that conductive vias 550' are built up in via openings 522, 532 in flexible dielectric adhesive layers 520, 530, respectively, as described above in relation to FIG. 29, but before metal foil 540 is laminated thereto. Conductive vias 550' are built up, such as by plating as above, only to a level that is at or is preferably slightly below the level of the exposed surface of adhesive layer 530. Thereafter, metal foil 540 is laminated to adhesive layer 530, as described above in relation to FIG. 28, here producing the structure shown in FIG. 28A. At this point, conductive vias 550' may or may not be in electrical contact with metal foil 540 and the slightly undersized openings 542 therein are not filled with conductive material. Conductive vias 550' are built up further to fill openings 542 in metal foil 540 with conductive material and to complete conductive connections between metal foil 540 and metal foil 510, also as described above, producing again the structure shown in FIG. 29, and plating with an AC electrical source may be preferred to reduce or eliminate any tendency for oxidation between the two layers of metal foil. Metal foils 510, 540 are patterned and etched to form patterns of electrical conductors and oxidation resistant layers 560, 570 are preferably applied thereto, as described above.

It is noted that where the geometry of flexible adhesive interposer 500 could result in shadowing or shielding effects that could interfere with the plating of conductive metal into the via openings 522, 532, and/or 542, such as where the final depth of such via openings is greater or much greater than the diameter thereof, another variation of the foregoing method for making flexible adhesive interposer 500 may be advantageous. In such instance, for example, flexible adhesive layer 520 may be deposited onto metal foil 510 and conductive metal is plated into the via openings 522 thereof, preferably to a level slightly below the exposed surface of layer 520, as described above. A second flexible adhesive layer 530 is deposited on layer 520 and conductive metal is plated into the via openings 532 thereof to further build up the conductive material previously built up in via openings 522 of layer 520, preferably to a level slightly below the exposed surface of layer 530, as described above. Any desired number of layers of flexible adhesive may be built up in this manner. Preferably, each flexible adhesive layer is cured prior to deposition of the next such layer, with the topmost flexible adhesive layer remaining B-staged or dried for lamination of metal foil 540 thereto. In this manner, conductive vias 550 that have a length through the two or more flexible adhesive layers that is long relative to the diameter of the conductive vias may be formed, e.g., conductive vias of 100 $\mu$m (about 4 mil) diameter and a length of 200 $\mu$m (about 8 mils) or more.

Figure 25A:
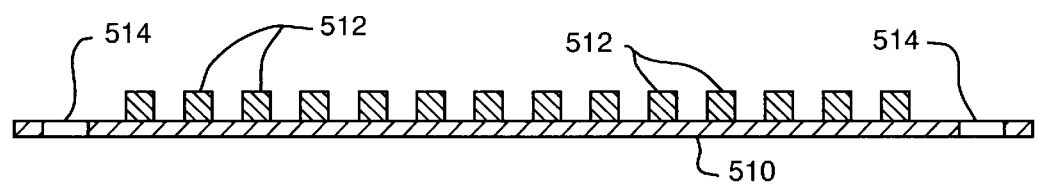
Figure 25B:
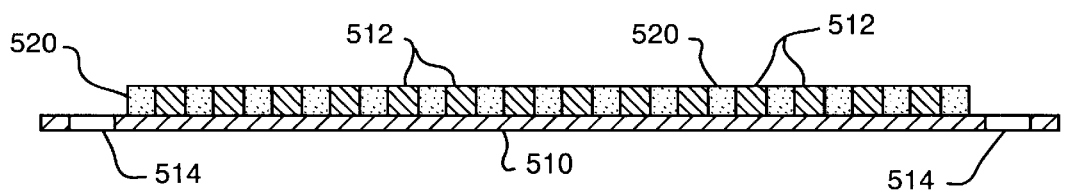

Further, it may be advantageous to form the via openings 522, 532 in flexible adhesive layers 520, 530, respectively, by other than the screen or stencil utilized in depositing such layers, for example, where the diameter of the smallest via openings 522, 532 are very small, such as 50–75 $\mu$m (about 2–3 mils) diameter vias at a 100–175 $\mu$m (about 4–6 mil) pitch. Thus, the flexible adhesive layer 520 having a pattern of via openings 522 therein of FIG. 25 may be formed as shown in FIGS. 25A and 25B as follows. A pattern of temporary adhesive bumps 512 of an easily removable material is deposited, such as by stenciling, onto metal foil 510 as shown in FIG. 25A, which could be a strip, web or panel of such foil. Temporary bumps 512 are in the same pattern as is desired for via openings 522, i.e. at each location where a via opening 522 is to remain, and each temporary bump 512 is of the same diameter as the via opening 522 that it defines. Bumps 512 are deposited, and are dried or B-staged, as appropriate, and are of a material that will adhere to metal foil 510 when dry or B-staged. Thus, a temporary bump 512 for a via opening 522 having a given diameter is deposited at the same diameter and with a wet thickness about the same dimension as its diameter or less on metal foil 510. The height of bumps 512 decreases with drying or B-staging, and so would be deposited at a greater thickness than the desired thickness of flexible adhesive layer 520.

Thus, for example, a temporary bump 512 for a via opening 522 having a given diameter of 50–75 $\mu$m (about 2–3 mils)in a 125 $\mu$m thick (about 5-mil thick) flexible adhesive layer 520 is deposited at that same diameter of 50–75 $\mu$m (about 2–3 mils) and with a wet thickness about the same as the diameter or 75 $\mu$m (about 3 mils). The height of adhesive bumps 512 decreases with B-staging, typically to about 60% of the wet thickness thereof, so that a 75 $\mu$m (about 3 mils) high bump decreases to a height of about 50 $\mu$m (about 2 mils) when B-staged. Bumps 512 may be built up to the desired thickness by successive deposition and B-staging of layers of the easily removable material until the number of layers necessary to provide the desired height is obtained. Suitable easily removable materials include photo resists, water-based polymers similar to hair gel, and soluble adhesives such as type MB7100 thermoplastic adhesive (soluble in mineral spirits), type WB7120 adhesive (soluble in polyvinyl alcohol) and type CP7130 thermoplastic adhesive (soluble in mineral spirits), available from AI Technology. Suitable materials for bumps 512, while soluble in certain solvents, are selected for the characteristic of not being soluble in the solvent utilized in the flexible dielectric adhesive of which layer 520 is to be formed.

Flexible dielectric adhesive is deposited or drawn down onto metal foil 510 at a wet thickness similar to the height of temporary bumps 512, but the thickness thereof may be slightly greater or lesser. A suitable flexible adhesive includes type CC7450 thermosetting adhesive available from AI Technology which has a substantially higher surface energy than does the types MB7100 and CP7130 adhesives of temporary bumps 512 and so will have a natural tendency to pull away from the bumps 512 thus leaving the temporary bumps 512 free of the dielectric layer 520 and facilitating their removal. Alternatively, a film or sheet of B-staged adhesive having a thickness that is the same as or less than the height of bumps 512 may be laminated to metal foil 510. For example, a film or sheet of B-staged type CC7450 adhesive can be laminated to metal foil 510 at about 70–90° C. without deforming or collapsing bumps 512 because adhesives types MB7100 and CP7130 melt at a sufficiently higher temperature of about 100–110° C. This produces the structure shown in FIG. 25B. Suitable materials for the flexible dielectric adhesive of layer 520, while soluble in certain solvents, are selected for the characteristic of not being soluble in the solvent utilized with the material of bumps 512.

Flexible adhesive layer 520 is then B-staged or cured as necessary to resist the solvent to be utilized in removing temporary bumps 512 and to adhere to metal foil 510. If a thicker dielectric layer is desired, successive depositions of temporary bumps 512 and/or flexible adhesive layers 520 may be utilized to reach the desired thickness, with the materials utilized therefor being dried or B-staged as necessary prior to the next successive deposition. For example, if the bumps 512 are 125 $\mu$m high, the resulting 125 $\mu$m thick layer 520 of wet adhesive will shrink to about 75 $\mu$m thickness when B-staged and so a second application thereof is utilized to reach the desired thickness of about 125 $\mu$m. Additional applications thereof may be utilized to provide greater thicknesses, and it is desirable that the final or topmost layer of flexible adhesive not be cured, but be B-staged to be ready for the subsequent lamination of a further metal foil layer thereto.

Bumps 512 are removed with a solvent such as mineral spirits or other non-polar type solvent that is incompatible with the polar solvent utilized in the type CC7450 flexible dielectric adhesive layers 520, 530, or with water or warm water if water-based material is used for bumps 512, or with typical resist stripping solutions if photoresist is used therefor. The remained of the processing of flexible adhesive interposer 500 is as described above in relation to FIGS. 26–30.

The foregoing method is suitable for making flexible adhesive interposers 500 individually or for making a number of interposers 500 contemporaneously, as where panels or webs of metal foil 510, 540, and/or of flexible adhesive layers 520, 530 are utilized in a batch process or in a continuous process. In a batch process, a panel or panels, e.g., a 25 by 31 cm (about 10 by 12 inch) panel or a 31 by 50 cm (about 12 by 20 inch) panel, of the aforementioned material or materials is utilized and a number of interposers 500 are formed therewith and thereon, such as by screen and/or stencil deposition of layers of flexible adhesive 520,

520. In a continuous process, a web or strip, e.g., of a 12.5 to 25 cm (about 5 inch to 10 inch) width, is utilized and is moved along as the various layers are roll deposited thereon or are roll laminated thereto. The web or strip may have drive sprocket holes along one or both edges thereof for moving it along in a controlled manner. After a plurality of flexible adhesive interposers 500 are formed in a panel or strip, the panel or strip, as the case may be, is excised to produce the individual interposers 500 therefrom.

It is noted that, alternatively, via conductors may formed by filling the via holes with flexible conductive adhesive, preferably after coating the exposed metal at the bottom of the vial hole with an oxidation-resistant material, such as a precious metal, such as gold, palladium, nickel-gold and the like.

Figure 31:
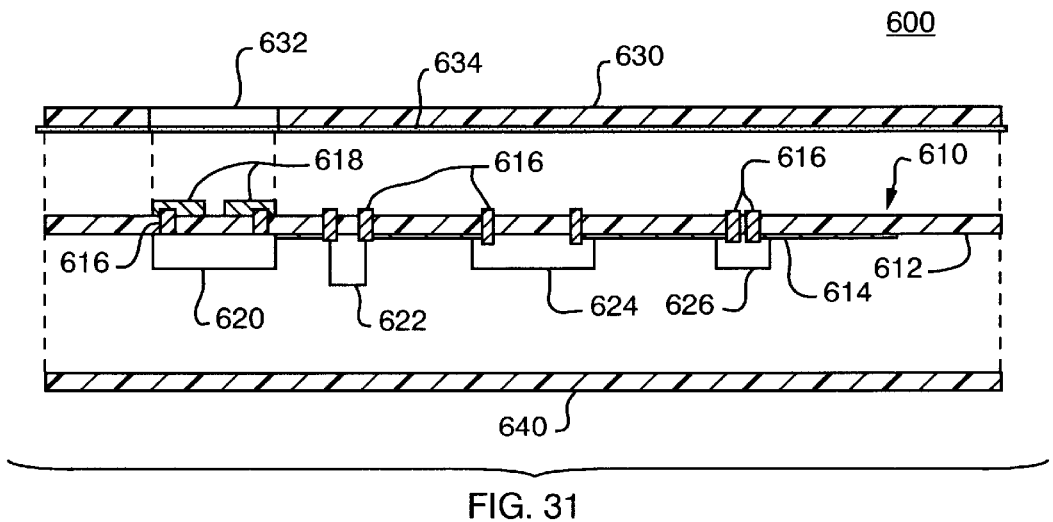
FIGS. 31 and 32 are exploded and side cross-sectional views, respectively, of a card employing a flexible adhesive interposer in accordance with the present invention.
Figure 32:
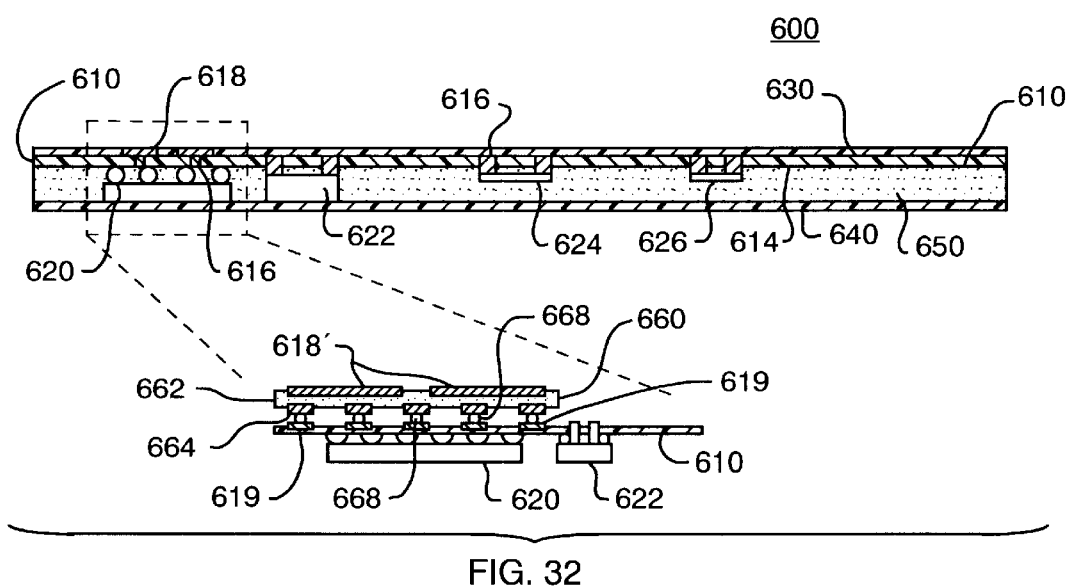

While the present invention has been described in terms of the foregoing exemplary embodiments, variations within the scope and spirit of the present invention as defined by the claims following will be apparent to those skilled in the art. For example, while the electronic device contained within each of the various embodiments of the package described herein are described as a semiconductor chip or die, such as an integrated circuit or the like, such devices may include other types and kinds of electronic components such as resistors, capacitors, inductors, and networks of such devices and combinations thereof, as well as plural semiconductor chips or die, either alone or in combination with other components. In FIG. 31, an exploded view, and FIG. 32, a side cross-sectional view, for example, a "smart card" 600 employs a flexible adhesive interposer 610 as described herein in accordance with the present invention. Interposer 610 includes a flexible dielectric adhesive core 612 having on one side thereof a metal foil that is patterned into conductors 614 between conductive vias 616 through flexible adhesive layer 612 and on the other side thereof a metal foil that is patterned into a pattern of contacts 618. One or more electronic devices, such as integrated circuit 620 and components 622, 624, 626, which may be further integrated circuits, resistors, capacitors, inductors, diodes, transistors and so forth, are attached to interposer 610 with their respective contacts electrically connected to via conductors 616, such as by solder or conductive adhesive, typically less than 0.5 mm (about 20 mils) in height including the electronic device and its mounting. A first cover sheet 630, such as a polyvinyl chloride (PVC) sheet overlies interposer 610 and is attached thereto by a layer of adhesive 634. Cover sheet 630 has an opening therein into which contacts 618 are positioned for being accessible from external to the card 600, as is desired in a contact-type smart card wherein contacts 618 make electrical contact to corresponding contacts of a reader device. A second PVC cover sheet 640 overlies the other surface of flexible adhesive interposer 610 to protect electronic components 620–626 thereon, which components are surrounded by an adhesive or other encapsulant 650 that attaches cover 640 to flexible adhesive interposer 610.

Where plural layers are employed in the flexible dielectric adhesive interposers described herein, such as those of FIGS. 14A and 14B, it is evident that a greater or lesser number of layers may be utilized to achieve more complex or simpler fan-out patterns as may be convenient in any particular instance, without departing from the inventive concept described herein or the method of making a particular embodiment or alternative thereto. Likewise, such fanout pattern may be utilized in any of the embodiments of flexible adhesive interposers, including those having plural metal conductive foil layers such as those of FIGS. 29, 30, and 31. In the enlarged inset to FIG. 32 is shown an alternative in relation to smart card 600, for example, in which a further flexible adhesive interposer 660 is utilized to provide additional conductive connections to and/or fan out between electronic device 620 and contacts 618'. Interposer 660 includes flexible adhesive layer 662 and a patterned metal foil providing contacts 664 that are connected by solder or conductive adhesive 668 to corresponding contacts 619 of flexible adhesive interposer 610.

Flexible adhesive interposers according to the present invention may be provided with bumps of solder or of conductive adhesive on the contacts thereof to facilitate the attachment of semiconductor chips and other electronic devices thereto, and/or with a pre-applied epoxy underfill adhesive, such as AI Technology type ESP7675, thereon, and/or with a pre-applied adhesive film, such as AI Technology type ESP7450, thereon for bonding other items, such as a shaping frame or cover, thereto.

In addition, the electronic device packages of the present, invention may be employed in combination with other conventional mounting technology, such as ball-grid array (BGA) technology and pin-grid array (PGA) technology. In such case a package according to the present invention is mounted to a conventional BGA or PGA solderable substrate which is in turn attached to a next-level substrate in conventional BGA or PGA manner.

What is claimed is:

1. An electronic package having contacts adapted to be attached to a substrate, said electronic package comprising:
    at least one electronic device, said electronic device having a plurality of contacts thereon;
    a flexible dielectric adhesive interposer including:
        at least one layer of flexible dielectric adhesive having a modulus of elasticity less than about 500,000 psi,
        a plurality of conductive vias through said layer of flexible dielectric adhesive, said plurality of conductive vias being in a pattern corresponding to a pattern of contacts of one of said electronic device and a substrate, wherein at least certain ones of said plurality of conductive vias correspond to ones of the contacts of said electronic device, and
        a metal foil on one surface of said layer of flexible dielectric adhesive, wherein said metal foil is patterned and is in electrical contact with ones of said conductive vias,
        wherein one of the plurality of conductive vias and the patterned metal foil includes contacts adapted to be attached to a substrate; and
        means for connecting the contacts of said electronic device to the certain ones of said conductive vias.

2. The electronic package of claim 1 wherein said plurality of conductive vias are in a pattern corresponding to the pattern of contacts of said electronic device, wherein said patterned metal foil fans out from the pattern of contacts of said electronic device to the pattern of contacts of the substrate.

3. The electronic package of claim 1 wherein said means for connecting includes connections of one of solder and electrically-conductive adhesive joining proximate corresponding ones of the contacts of said electronic device to the certain ones of said conductive vias.

4. The electronic package of claim 1 wherein said plurality of conductive vias are in a pattern corresponding to the pattern of contacts of the substrate, wherein said patterned metal foil fans out from the pattern of contacts of the substrate to a pattern related to the pattern of contacts of said electronic device.

5. The electronic package of claim 4 wherein said electronic device is attached to said flexible dielectric adhesive interposer with its contacts distal therefrom, and wherein said means for connecting includes wires bonded between the contacts of said electronic device and ones of said conductive vias.

6. The electronic package of claim 1 further comprising a protective enclosure surrounding said electronic device and attached to said flexible dielectric adhesive interposer at least along its periphery.

7. The electronic package of claim 6 wherein said protective enclosure is one of a cover attached at its edges to the periphery of said flexible dielectric adhesive interposer and an encapsulant surrounding said electronic device and bonded to said flexible dielectric adhesive interposer at least along the periphery thereof.

8. The electronic package of claim 6 wherein said protective enclosure includes a cover attached at its edges to the periphery of said flexible dielectric adhesive interposer and attached by a flexible adhesive to a surface of said electronic device distal said flexible dielectric adhesive interposer.

9. The electronic package of claim 1 wherein said flexible dielectric adhesive has a modulus of elasticity less than about 100,000 psi.

10. The electronic package of claim 1 wherein said flexible dielectric adhesive has a modulus of elasticity less than about 20,000 psi.

11. The electronic package of claim 1 further comprising an underfill adhesive bonding said electronic device and said flexible dielectric adhesive interposer.

12. The electronic package of claim 11 wherein said underfill adhesive includes flexible dielectric adhesive having a modulus of elasticity less than about 500,000 psi.

13. The electronic package of claim 1 wherein said conductive vias are built up of metal plated into holes in said at least one layer of flexible dielectric adhesive.

14. An electronic package for plural electronic devices comprising:
   a plurality of electronic devices, each said electronic device having a pattern of a plurality of contacts thereon;
   a plurality of flexible dielectric adhesive interposers each associated with at least one of said plurality of electronic devices, each including:
      at least one layer of flexible dielectric adhesive having a modulus of elasticity less than about 500,000 psi,
      a plurality of conductive vias through said layer of flexible dielectric adhesive, said plurality of conductive vias being in a pattern, wherein at least certain ones of said plurality of conductive vias correspond to ones of the contacts of the associated one of said plurality of electronic devices, and
      a metal foil on one surface of said layer of flexible dielectric adhesive, wherein said metal foil is patterned and is in electrical contact with ones of said conductive vias;
   wherein at least one of said plurality of conductive vias and said patterned metal foil includes external contacts adapted for connecting said flexible dielectric adhesive interposer to an external device; and means for connecting the contacts of each of said plurality of electronic devices to the certain ones of said conductive vias of the flexible dielectric adhesive interposer with which it is associated,
   wherein said plurality of flexible dielectric adhesive interposers are positioned adjacent each other and further comprising:
      means for connecting the external contacts of each of said plurality of flexible dielectric adhesive interposers to the external contacts of an adjacent one of said plurality of flexible dielectric adhesive interposers.

15. The electronic package of claim 14 wherein each said flexible dielectric adhesive interposer enfolds the one of said plurality of electronic devices with which it is associated.

16. The electronic package of claim 15 wherein at least one of said plurality of flexible dielectric adhesive interposers includes at least further certain ones of said plurality of conductive vias that correspond to the contacts of said one of said plurality of electronic devices associated with the adjacent one of said plurality of flexible dielectric adhesive interposers.

17. The electronic package of claim 16 wherein the patterns of contacts of the electronic devices associated with the at least one of said plurality of flexible dielectric adhesive interposers and with the adjacent one of said plurality of flexible dielectric adhesive interposers are alike, and wherein the certain ones of said plurality of conductive vias and the further certain ones thereof of the at least one of said plurality of flexible dielectric adhesive interposers are arrayed in like patterns to each other and to the respective electronic devices associated therewith.

18. The electronic package of claim 14 wherein at least one of said plurality of flexible dielectric adhesive interposers includes at least further certain ones of said plurality of conductive vias that correspond to the contacts of said one of said plurality of electronic devices associated with the adjacent one of said plurality of flexible dielectric adhesive interposers.

19. The electronic package of claim 14 wherein said means for connecting the external contacts includes at least one further flexible dielectric adhesive interposer interposed between two adjacent ones of the plurality of flexible dielectric adhesive interposers, said further flexible dielectric adhesive interposer having at least one layer of flexible dielectric adhesive having a modulus of elasticity less than about 500,000 psi, and a plurality of conductive vias through said layer of flexible dielectric adhesive thereof, said plurality of conductive vias thereof being in a pattern corresponding to ones of the conductive vias of the two adjacent ones of the plurality of flexible dielectric adhesive interposers.

20. The electronic package of claim 19 wherein said further flexible dielectric adhesive interposer has a cavity therein at least as large as the one of the plurality of electronic devices associated with one of said two adjacent flexible dielectric adhesive interposers, and wherein said further flexible dielectric adhesive interposer and the one of said two adjacent flexible dielectric adhesive interposers are juxtaposed with the one of the plurality of electronic devices associated therewith in the cavity.

21. The electronic package of claim 14 wherein said means for connecting the external contacts includes at least one further dielectric interposer interposed between two adjacent ones of the plurality of flexible dielectric adhesive interposers, said further dielectric interposer having a plurality of conductive vias therethrough in a pattern corresponding to ones of the conductive vias of the two adjacent ones of the plurality of flexible dielectric adhesive interposers, wherein said further dielectric interposer has a cavity therein at least as large as the one of the plurality of electronic devices associated with one of said two adjacent flexible dielectric adhesive interposers, and wherein said further dielectric interposer and the one of said two adjacent flexible dielectric adhesive interposers are juxtaposed with the one of the plurality of electronic devices associated therewith in the cavity.

22. The electronic package of claim 14 wherein said patterned metal foil of at least one of said plurality of flexible dielectric adhesive interposers fans out from the pattern of contacts of the electronic device associated therewith to a pattern of contacts of a substrate.

23. The electronic package of claim 14 wherein said means for connecting includes connections of one of solder and electrically-conductive adhesive joining proximate corresponding ones of the contacts of said electronic device to the certain ones of said conductive vias.

24. The electronic package of claim 14 further comprising an encapsulating material encapsulating said pluralities of electronic devices and flexible dielectric adhesive interposers and bonded at least to said flexible dielectric adhesive interposers.

25. The electronic package of claim 14 wherein said flexible dielectric adhesive has a modulus of elasticity less than about 100,000 psi.

26. The electronic package of claim 14 wherein said flexible dielectric adhesive has a modulus of elasticity less than about 20,000 psi.

27. The electronic package of claim 14 wherein said conductive vias are built up of metal plated into holes in said at least one layer of flexible dielectric adhesive.

28. A flexible dielectric adhesive interposer comprising:
   a plurality of layers of flexible dielectric adhesive having a modulus of elasticity less than about 500,000 psi;
   a plurality of conductive vias through each of said layers of flexible dielectric adhesive, said plurality of conductive vias in each said layer of flexible dielectric adhesive being in a pattern corresponding at least in part to a pattern of said plurality of conductive vias of the adjacent layers of said flexible dielectric adhesive; and
   a metal foil between at least two of said layers of flexible dielectric adhesive, wherein said metal foil is patterned and is in electrical contact with ones of said conductive vias of each of the at least two of said layers of flexible dielectric adhesive.

29. The flexible dielectric adhesive interposer of claim 28 wherein said conductive vias are built up of plated metal.

30. The flexible dielectric adhesive interposer of claim 28 wherein said flexible dielectric adhesive has a modulus of elasticity less than about 100,000 psi.

31. The flexible dielectric adhesive interposer of claim 28 wherein said flexible dielectric adhesive has a modulus of elasticity less than about 20,000 psi.

32. The flexible dielectric adhesive interposer of claim 28 in combination with at least one electronic device having a plurality of contacts thereon connected to at least certain ones of said conductive vias of a first of said plurality of layers of flexible dielectric adhesive.

33. An electronic package for plural electronic devices comprising:
   a plurality of electronic modules, each said electronic module having a predetermined pattern of a plurality of external contacts on first and second opposing surfaces thereof, wherein each said electronic module includes:
      an electronic device having a pattern of contacts thereon;
      a first flexible dielectric adhesive interposer including:
         at least one layer of flexible dielectric adhesive having a modulus of elasticity less than about 500,000 psi,
         a plurality of conductive vias through said layer of flexible dielectric adhesive, said plurality of conductive vias being in a pattern, wherein at least first ones of said plurality of conductive vias correspond to the contacts of said electronic device, and wherein at least second ones of said plurality of conductive vias correspond to the predetermined pattern of the plurality of external contacts,
         means for electrically connecting corresponding ones of the contacts of said electronic device to corresponding first ones of said plurality of conductive vias; and
         a metal foil on one surface of said at least one layer of flexible dielectric adhesive, wherein said metal foil is patterned to provide electrical conductors between corresponding first and second ones of said conductive vias;
      a second dielectric interposer having a central opening therein, wherein said first flexible dielectric adhesive interposer and said second dielectric interposer are adjacent each other with said electronic device disposed in the central opening of said second dielectric interposer, said second dielectric interposer including a plurality of conductive vias in a pattern, wherein at least first ones of said plurality of conductive vias correspond to the predetermined pattern of the plurality of external contacts, and
      means for electrically connecting the second ones of the conductive vias of said first flexible dielectric adhesive interposer to corresponding first ones of the conductive vias of the second dielectric interposer, wherein unconnected ends of the second ones of the conductive vias of said first flexible dielectric adhesive interposer and unconnected ends of the first ones of the conductive vias of the second dielectric interposer provide said external contacts, and
   means for electrically connecting the external contacts on the respective first surface of each of said plurality of electronic modules to the external contacts on the second surface of an adjacent one of said electronic modules, wherein said plurality of electronic modules are positioned adjacent each other and are electrically connected.

34. The electronic package of claim 33 wherein said patterned metal foil of at least one of said plurality of flexible dielectric adhesive interposers fans out from the pattern of contacts of the electronic device associated therewith to a pattern of contacts of a substrate.

35. The electronic package of claim 33 wherein said means for electrically connecting corresponding ones of the contacts of said electronic device includes connections of one of solder and electrically-conductive adhesive joining proximate corresponding contacts of said electronic device to the first ones of said conductive vias.

36. The electronic package of claim 33 wherein said means for electrically connecting the second ones of the conductive vias includes connections of one of solder and electrically-conductive adhesive joining the second ones of the conductive vias of said first flexible dielectric adhesive interposer to proximate corresponding ones of the first ones of the conductive vias of said second dielectric interposer.

37. The electronic package of claim 33 wherein said means for connecting the external contacts includes connections of one of solder and electrically-conductive adhesive.

38. The electronic package of claim 33 wherein said flexible dielectric adhesive has a modulus of elasticity less than about 100,000 psi.

39. The electronic package of claim 33 wherein said flexible dielectric adhesive has a modulus of elasticity less than about 20,000 psi.

40. The electronic package of claim 33 wherein said conductive vias are built up of metal plated into holes in said at least one layer of flexible dielectric adhesive.

41. The electronic package of claim 33 wherein said second dielectric interposer includes at least one layer of flexible dielectric adhesive having a modulus of elasticity less than about 500,000 psi, wherein said plurality of conductive vias are through said layer of flexible dielectric adhesive.

42. The electronic package of claim 41 wherein said flexible dielectric adhesive has a modulus of elasticity less than about 100,000 psi.

43. The electronic package of claim 41 wherein said flexible dielectric adhesive has a modulus of elasticity less than about 20,000 psi.

44. The electronic package of claim 41 wherein said conductive vias are built up of metal plated into holes in said at least one layer of flexible dielectric adhesive.

45. The electronic package of claim 33 further comprising an encapsulating material encapsulating said electronic devices, said first flexible dielectric adhesive interposer and said second dielectric interposer.

46. A method of making an electronic package for an electronic device comprising:
   providing a sheet of metal foil;
   providing at least one layer of a flexible dielectric adhesive having a modulus of elasticity less than about 500,000 psi on one surface of the sheet of metal foil, the layer of flexible dielectric adhesive having a plurality of via openings therein;
   building up conductive material on the metal foil to fill the via openings, thereby forming conductive vias therein;
   patterning the metal foil to form a pattern of contacts and conductors electrically connected to the conductive vias in the flexible dielectric adhesive layer;
   plating at least one of the conductive vias and the contacts of the patterned metal foil to provide external contacts; and
   electrically connecting contacts of at least one electronic device to corresponding ones of the conductive vias.

47. The method of claim 46 wherein said providing at least one layer of flexible dielectric adhesive includes depositing a layer of flexible dielectric adhesive on the sheet of metal foil.

48. The method of claim 46 wherein said providing at least one layer of flexible dielectric adhesive includes laminating a sheet of flexible dielectric adhesive to the sheet of metal foil.

49. The method of claim 46 further comprising forming the via openings in the sheet of flexible dielectric adhesive one of before and after said laminating a sheet of flexible dielectric adhesive to the sheet of metal foil.

50. The method of claim 46 wherein said building up the conductive material includes plating a metal on the metal foil in the via openings.

51. The method of claim 46 further comprising providing, after said patterning the metal foil, at least a second layer of a flexible dielectric adhesive having a modulus of elasticity less than about 500,000 psi on the surface of the sheet of metal foil not having the at least one layer of flexible dielectric adhesive thereon, the at least second layer of flexible dielectric adhesive having a plurality of via openings therein; and building up conductive material on the metal foil to fill the via openings in the at least second layer of flexible dielectric adhesive, thereby forming conductive vias therein.

52. The method of claim 46 further comprising providing a second sheet of metal foil on the at least one layer of flexible dielectric adhesive, the second sheet of metal foil having a pattern of openings therein corresponding to the via openings of the at least one layer of flexible dielectric adhesive.

53. The method of claim 52 further comprising building up conductive material on the conductive vias in the at least one layer of flexible dielectric adhesive to fill the via openings in the metal foil, thereby forming conductive vias between the two sheets of metal foil.

54. An electronic package having contacts adapted to be attached to a substrate, said electronic package comprising:
   at least one electronic device, said electronic device having a plurality of contacts thereon;
   a flexible dielectric adhesive interposer including:
      at least one layer of flexible dielectric adhesive having a modulus of elasticity less than about 35,000 kg/cm$^2$,
      a plurality of conductive vias through said layer of flexible dielectric adhesive, said plurality of conductive vias being in a pattern corresponding to a pattern of contacts of one of said electronic device and a substrate, wherein at least certain ones of said plurality of conductive vias correspond to ones of the contacts of said electronic device, and
      a metal foil on one surface of said layer of flexible dielectric adhesive, wherein said metal foil is patterned and is in electrical contact with ones of said conductive vias,
      wherein one of the plurality of conductive vias and the patterned metal foil includes contacts adapted to be attached to a substrate; and
   means for connecting the contacts of said electronic device to the certain ones of said conductive vias.

55. The electronic package of claim 54 wherein said flexible dielectric adhesive has a modulus of elasticity less than about 7,000 kg/cm$^2$.

56. The electronic package of claim 54 wherein said flexible dielectric adhesive has a modulus of elasticity less than about 1,400 kg/cm$^2$.

57. The electronic package of claim 54 further comprising an underfill adhesive bonding said electronic device and said flexible dielectric adhesive interposer, wherein said underfill adhesive includes flexible dielectric adhesive having a modulus of elasticity less than about 35,000 kg/cm$^2$.

58. An electronic package for plural electronic devices comprising:
   a plurality of electronic devices, each said electronic device having a pattern of a plurality of contacts thereon;
   a plurality of flexible dielectric adhesive interposers each associated with at least one of said plurality of electronic devices, each including:
      at least one layer of flexible dielectric adhesive having a modulus of elasticity less than about 35,000 kg/cm$^2$,
      a plurality of conductive vias through said layer of flexible dielectric adhesive, said plurality of conductive vias being in a pattern, wherein at least certain ones of said plurality of conductive vias correspond to ones of the contacts of the associated one of said plurality of electronic devices, and
      a metal foil on one surface of said layer of flexible dielectric adhesive, wherein said metal foil is patterned and is in electrical contact with ones of said conductive vias;

wherein at least one of said plurality of conductive vias and said patterned metal foil includes external contacts adapted for connecting said flexible dielectric adhesive interposer to an external device; and means for connecting the contacts of each of said plurality of electronic devices to the certain ones of said conductive vias of the flexible dielectric adhesive interposer with which it is associated, wherein said plurality of flexible dielectric adhesive interposers are positioned adjacent each other and further comprising:

means for connecting the external contacts of each of said plurality of flexible dielectric adhesive interposers to the external contacts of an adjacent one of said plurality of flexible dielectric adhesive interposers.

59. The electronic package of claim 58 wherein said means for connecting the external contacts includes at least one further flexible dielectric adhesive interposer interposed between two adjacent ones of the plurality of flexible dielectric adhesive interposers, said further flexible dielectric adhesive interposer having at least one layer of flexible dielectric adhesive having a modulus of elasticity less than about 35,000 kg/cm$^2$, and a plurality of conductive vias through said layer of flexible dielectric adhesive thereof, said plurality of conductive vias thereof being in a pattern corresponding to ones of the conductive vias of the two adjacent ones of the plurality of flexible dielectric adhesive interposers.

60. The electronic package of claim 58 wherein said flexible dielectric adhesive has a modulus of elasticity less than about 7,000 kg/cm$^2$.

61. The electronic package of claim 58 wherein said flexible dielectric adhesive has a modulus of elasticity less than about 1,400 kg/cm$^2$.

62. A flexible dielectric adhesive interposer comprising:

a plurality of layers of flexible dielectric adhesive having a modulus of elasticity less than about 35,000 kg/cm$^2$;

a plurality of conductive vias through each of said layers of flexible dielectric adhesive, said plurality of conductive vias in each said layer of flexible dielectric adhesive being in a pattern corresponding at least in part to a pattern of said plurality of conductive vias of the adjacent layers of said flexible dielectric adhesive; and a metal foil between at least two of said layers of flexible dielectric adhesive, wherein said metal foil is patterned and is in electrical contact with ones of said conductive vias of each of the at least two of said layers of flexible dielectric adhesive.

63. The flexible dielectric adhesive interposer of claim 62 wherein said flexible dielectric adhesive has a modulus of elasticity less than about 7,000 kg/cm$^2$.

64. The flexible dielectric adhesive interposer of claim 62 wherein said flexible dielectric adhesive has a modulus of elasticity less than about 1,400 kg/cm$^2$.

65. An electronic package for plural electronic devices comprising:

a plurality of electronic modules, each said electronic module having a predetermined pattern of a plurality of external contacts on first and second opposing surfaces thereof, wherein each said electronic module includes:

an electronic device having a pattern of contacts thereon;

a first flexible dielectric adhesive interposer including:
at least one layer of flexible dielectric adhesive having a modulus of elasticity less than about 35,000 kg/cm$^2$, a plurality of conductive vias through said layer of flexible dielectric adhesive, said plurality of conductive vias being in a pattern, wherein at least first ones of said plurality of conductive vias correspond to the contacts of said electronic device, and wherein at least second ones of said plurality of conductive vias correspond to the predetermined pattern of the plurality of external contacts, means for electrically connecting corresponding ones of the contacts of said electronic device to corresponding first ones of said plurality of conductive vias; and a metal foil on one surface of said at least one layer of flexible dielectric adhesive, wherein said metal foil is patterned to provide electrical conductors between corresponding first and second ones of said conductive vias;

a second dielectric interposer having a central opening therein, wherein said first flexible dielectric adhesive interposer and said second dielectric interposer are adjacent each other with said electronic device disposed in the central opening of said second dielectric interposer, said second dielectric interposer including a plurality of conductive vias in a pattern, wherein at least first ones of said plurality of conductive vias correspond to the predetermined pattern of the plurality of external contacts, and means for electrically connecting the second ones of the conductive vias of said first flexible dielectric adhesive interposer to corresponding first ones of the conductive vias of the second dielectric interposer, wherein unconnected ends of the second ones of the conductive vias of said first flexible dielectric adhesive interposer and unconnected ends of the first ones of the conductive vias of the second dielectric interposer provide said external contacts, and means for electrically connecting the external contacts on a respective first surface of each of said plurality of electronic modules to the external contacts on the second surface of an adjacent one of said electronic modules, wherein said plurality of electronic modules are positioned adjacent each other and are electrically connected.

66. The electronic package of claim 65 wherein said flexible dielectric adhesive has a modulus of elasticity less than about 7,000 kg/cm$^2$.

67. The electronic package of claim 65 wherein said flexible dielectric adhesive has a modulus of elasticity less than about 1,400 kg/cm$^2$.

68. The electronic package of claim 65 wherein said second dielectric interposer includes at least one layer of flexible dielectric adhesive having a modulus of elasticity less than about 35,000 kg/cm$^2$, wherein said plurality of conductive vias are through said layer of flexible dielectric adhesive.

69. The electronic package of claim 68 wherein said flexible dielectric adhesive has a modulus of elasticity less than about 7,000 kg/cm$^2$.

70. The electronic package of claim 68 wherein said flexible dielectric adhesive has a modulus of elasticity less than about 1,400 kg/cm$^2$.

71. A method for making an electronic package for plural electronic devices comprising:

providing a plurality of electronic devices, each electronic device having a pattern of a plurality of contacts thereon;

providing a plurality of flexible dielectric adhesive interposers each associated with at least one of the plurality of electronic devices, including:

providing at least one layer of flexible dielectric adhesive having a modulus of elasticity less than about 500,000 psi, building up a plurality of conductive vias through the layer of flexible dielectric adhesive, the plurality of conductive vias being built up in a pattern, wherein at least certain ones of the plurality of conductive vias correspond to ones of the contacts of the associated one of the plurality of electronic devices, and providing a metal foil on one surface of the layer of flexible dielectric adhesive, and patterning the metal foil in a pattern for being in electrical contact with ones of the conductive vias;

wherein at least one of the plurality of conductive vias and the patterned metal foil includes external contacts adapted for connecting the flexible dielectric adhesive interposer to an external device; and connecting the contacts of each of the plurality of electronic devices to the certain ones of the conductive vias of the flexible dielectric adhesive interposer with which it is associated, wherein the plurality of flexible dielectric adhesive interposers are positioned adjacent each other and further comprising:

connecting the external contacts of each of the plurality of flexible dielectric adhesive interposers to the external contacts of an adjacent one of the plurality of flexible dielectric adhesive interposers.

* * * * *